US012560195B2

(12) United States Patent
Wang et al.

(10) Patent No.: US 12,560,195 B2
(45) Date of Patent: Feb. 24, 2026

(54) ROTATION SHAFT MECHANISM AND ELECTRONIC DEVICE

(71) Applicant: BOE Technology Group Co., Ltd., Beijing (CN)

(72) Inventors: Xinyu Wang, Beijing (CN); Pengfei Zhou, Beijing (CN); Yonghong Zhou, Beijing (CN); Shangchieh Chu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 309 days.

(21) Appl. No.: 18/016,288

(22) PCT Filed: Feb. 28, 2022

(86) PCT No.: PCT/CN2022/078369
§ 371 (c)(1),
(2) Date: Jan. 13, 2023

(87) PCT Pub. No.: WO2023/159586
PCT Pub. Date: Aug. 31, 2023

(65) Prior Publication Data
US 2024/0410415 A1     Dec. 12, 2024

(51) Int. Cl.
*F16C 11/04*          (2006.01)
*H05K 5/02*          (2006.01)

(52) U.S. Cl.
CPC ............ *F16C 11/04* (2013.01); *H05K 5/0226* (2013.01)

(58) Field of Classification Search
CPC ...... F16C 11/04; H05K 5/0226; H04M 1/022; G06F 1/1681; G06F 1/1652
See application file for complete search history.

(56) References Cited

U.S. PATENT DOCUMENTS

| | | | | | |
|---|---|---|---|---|---|
| 9,462,713 | B2 * | 10/2016 | Hsu | ...................... | H05K 5/0226 |
| 10,070,546 | B1 * | 9/2018 | Hsu | ........................... | E05D 7/00 |
| 10,520,988 | B2 * | 12/2019 | Hsu | ........................ | G06F 1/1618 |
| 10,754,395 | B2 * | 8/2020 | Sanchez | ................ | G06F 1/1618 |
| 11,365,573 | B2 * | 6/2022 | Hsu | ........................... | E05D 3/18 |
| 11,379,015 | B2 * | 7/2022 | Lin | ....................... | G06F 1/1677 |
| 11,516,932 | B2 * | 11/2022 | Sim | ........................ | E05D 3/122 |

(Continued)

FOREIGN PATENT DOCUMENTS

| | | |
|---|---|---|
| CN | 109936648 A | 6/2019 |
| CN | 209731335 U | 12/2019 |

(Continued)

*Primary Examiner* — Jason W San
*Assistant Examiner* — Matthew J Sullivan
(74) *Attorney, Agent, or Firm* — IPro, PLLC

(57) ABSTRACT

Provided is a rotation shaft mechanism. The rotation shaft mechanism includes a base and two support assemblies. The two support assemblies are respectively connected to two sides of the base, and the support assembly includes a rotation plate and a shutter plate. The rotation plate is pivoted to the base, the shutter plate is disposed on a face of the rotation plate and is slidable in a direction close to or away from the base relative to the rotation plate, and an orthogonal projection of the base on a plane of the shutter plate is at least partially overlapped with the shutter plate in the case that the rotation shaft mechanism is in an unfolded state.

17 Claims, 17 Drawing Sheets

(56)     References Cited

U.S. PATENT DOCUMENTS

| | | | | |
|---|---|---|---|---|
| 11,659,073 | B1 * | 5/2023 | Hsu | H04M 1/022 |
| | | | | 16/221 |
| 11,889,644 | B2 * | 1/2024 | Yang | H04M 1/022 |
| 12,010,254 | B2 * | 6/2024 | Liu | H04M 1/022 |
| 12,069,825 | B2 * | 8/2024 | Feng | G06F 1/1652 |
| 12,130,668 | B2 * | 10/2024 | Liu | G09F 9/301 |
| 2018/0309861 | A1 * | 10/2018 | Lin | H04M 1/021 |
| 2020/0097051 | A1 * | 3/2020 | Liu | G06F 1/1652 |
| 2020/0323091 | A1 * | 10/2020 | Nagai | H04M 1/022 |
| 2022/0247843 | A1 | 8/2022 | Hu et al. | |
| 2023/0164253 | A1 | 5/2023 | Xu et al. | |
| 2023/0262150 | A1 * | 8/2023 | Wu | G06F 1/1681 |
| | | | | 455/575.3 |
| 2024/0023261 | A1 * | 1/2024 | Park | F16C 11/04 |
| 2024/0121905 | A1 * | 4/2024 | Cao | G09F 9/301 |
| 2024/0171665 | A1 * | 5/2024 | Zhang | F16C 11/04 |
| 2024/0219967 | A1 * | 7/2024 | Wang | G06F 1/1656 |
| 2024/0281041 | A1 * | 8/2024 | Liu | G06F 1/1641 |
| 2025/0027531 | A1 * | 1/2025 | Shen | F16C 11/04 |

FOREIGN PATENT DOCUMENTS

| | | | |
|---|---|---|---|
| CN | 112751951 A | 5/2021 |
| CN | 213424437 U | 6/2021 |
| CN | 113542456 A | 10/2021 |
| CN | 215567226 U | 1/2022 |

* cited by examiner

25

25a''

25a'

25a

14

141

141

141

ROTATION SHAFT MECHANISM AND ELECTRONIC DEVICE

CROSS-REFERENCE TO RELATED APPLICATION

This application is a U.S. national stage of international application No. PCT/CN2022/078369, filed on Feb. 28, 2022, the disclosure of which is herein incorporated by reference in its entirety.

TECHNICAL FIELD

The present disclosure relates to the field of electronic devices, and in particular, relates to a rotation shaft mechanism and an electronic device.

BACKGROUND OF THE INVENTION

Outward fordable electronic devices generally include a flexible display panel, a rotation shaft mechanism, and two housings.

SUMMARY OF THE INVENTION

Embodiments of the present disclosure provide a rotation shaft mechanism and an electronic device. The technical solutions are as follows.

According to some embodiments of the present disclosure, a rotation shaft mechanism is provided. The rotation shaft mechanism includes: a base and two support assemblies, wherein the two support assemblies are respectively connected to two sides of the base, and the support assembly includes a rotation plate and a shutter plate, wherein the rotation plate is pivoted to the base, the shutter plate is disposed on a face of the rotation plate and is slidable in a direction close to or away from the base relative to the rotation plate, and an orthogonal projection of the base on a plane of the shutter plate is at least partially overlapped with the shutter plate in the case that the rotation shaft mechanism is in an unfolded state.

In some embodiments, the support assembly further includes a slide plate and a linkage; wherein the slide plate is disposed on a face, distal from the shutter plate, of the rotation plate, and is slidable in the direction close to or away from the base relative to the rotation plate; and the linkage is disposed between the slide plate and the shutter plate, is in rotatable connection to the rotation plate, and is configured to link the slide plate and the shutter plate.

In some embodiments, the slide plate is provided with a first drive slot, the shutter plate is provided with a second drive slot, and the linkage includes a body, a first pin shaft, and a second pin shaft, wherein the body is in rotatable connection to the rotation plate, and the first pin shaft and the second pin shaft are respectively disposed on two sides of the body and are respectively disposed in the first drive slot and the second drive slot.

In some embodiments, the second drive slot is a strip slot, and an extension direction of the strip slot is parallel to a rotation axis of the rotation plate, or an included angle between the extension direction of the strip slot and the rotation axis of the rotation plate is an acute angle.

In some embodiments, the second drive slot is a V-shaped slot, or the second drive slot includes a strip portion and a V-shaped portion, wherein the V-shaped portion is disposed on an end of the strip portion, and an end of the V-shaped portion is connected to an end of the strip portion.

In some embodiments, the first drive slot is an arc slot, and the linkage includes two first pin shafts, wherein distances between the two first pin shafts and a rotation axis of the body are equal, and the two first pin shafts are disposed in the first drive slot.

In some embodiments, the slide plate is further provided with a first guide slot, wherein an extension direction of the first guide slot is perpendicular to a rotation axis of the rotation plate, a face, proximal to the slide plate, of the shutter plate is connected to a guide protrusion, and the guide protrusion is disposed in the first guide slot.

In some embodiments, the support assembly further includes a housing drive plate, wherein the housing drive plate is disposed between the rotation plate and the shutter plate, is slidable in the direction close to or away from the base relative to the rotation plate, and is provided with a third drive slot; and the linkage further includes a third pin shaft, wherein the third pin shaft and the second pin shaft are disposed on a same side of the body, and the third pin shaft is disposed in the third drive slot.

In some embodiments, at least one of the first drive slot and the third drive slot is an arc slot.

In some embodiments, a center portion of the arc slot bends towards a side away from a rotation axis of the body.

In some embodiments, one of the first drive slot and the third drive slot is a strip slot, and an extension direction of the strip slot is parallel to a rotation axis of the rotation plate, or an included angle between the extension direction of the strip slot and the rotation axis of the rotation plate is an acute angle.

In some embodiments, a face, proximal to the slide plate, of the rotation plate is provided with a protrusion block; and the slide plate is provided with a second guide slot, wherein the second guide slot extends from one side, proximal to the base, of the slide plate to the other side, and the protrusion block is disposed in the second guide slot.

In some embodiments, the base includes a mount and a connector, wherein a center portion of the connector is connected to the mount, two ends of the connector respectively extend in two sides of the mount, are bendable relative to the mount, and are respectively connected to the slide plates of the two support assemblies.

In some embodiments, the connector is a chain, wherein the chain includes a plurality of links, an edge of each of the links being provided with teeth, the teeth of adjacent links are engageable.

According to some embodiments of the present disclosure, an electronic device is provided. The electronic device includes two housings and any of above rotation shaft mechanism, wherein the two housings are respectively connected to two support assemblies of the rotation shaft mechanism.

BRIEF DESCRIPTION OF DRAWINGS

For clearer description of the technical solutions in the embodiments of the present disclosure, the following briefly describes the accompanying drawings required for describing the embodiments. Apparently, the accompanying drawings in the following description show merely some embodiments of the present disclosure, and those of ordinary skill in the art may still derive other drawings from these accompanying drawings without any creative efforts.

Figure 1:
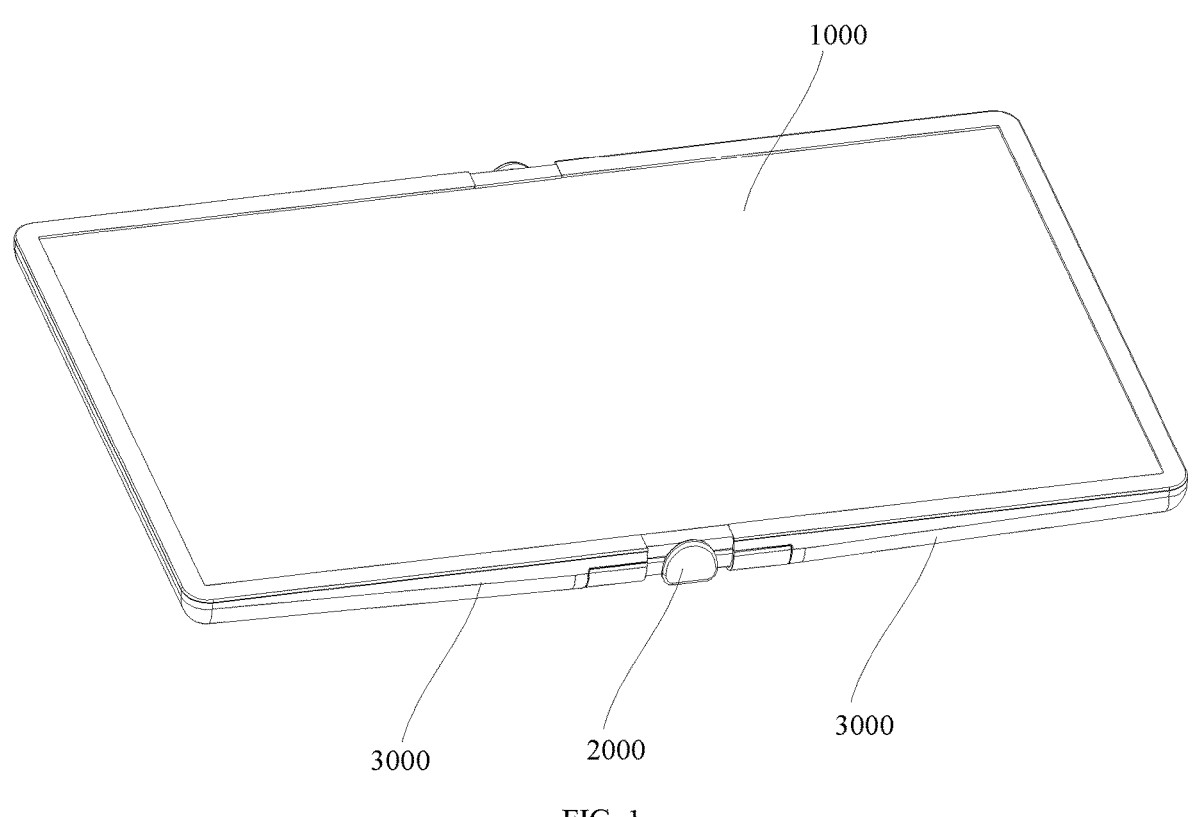
Figure 2:
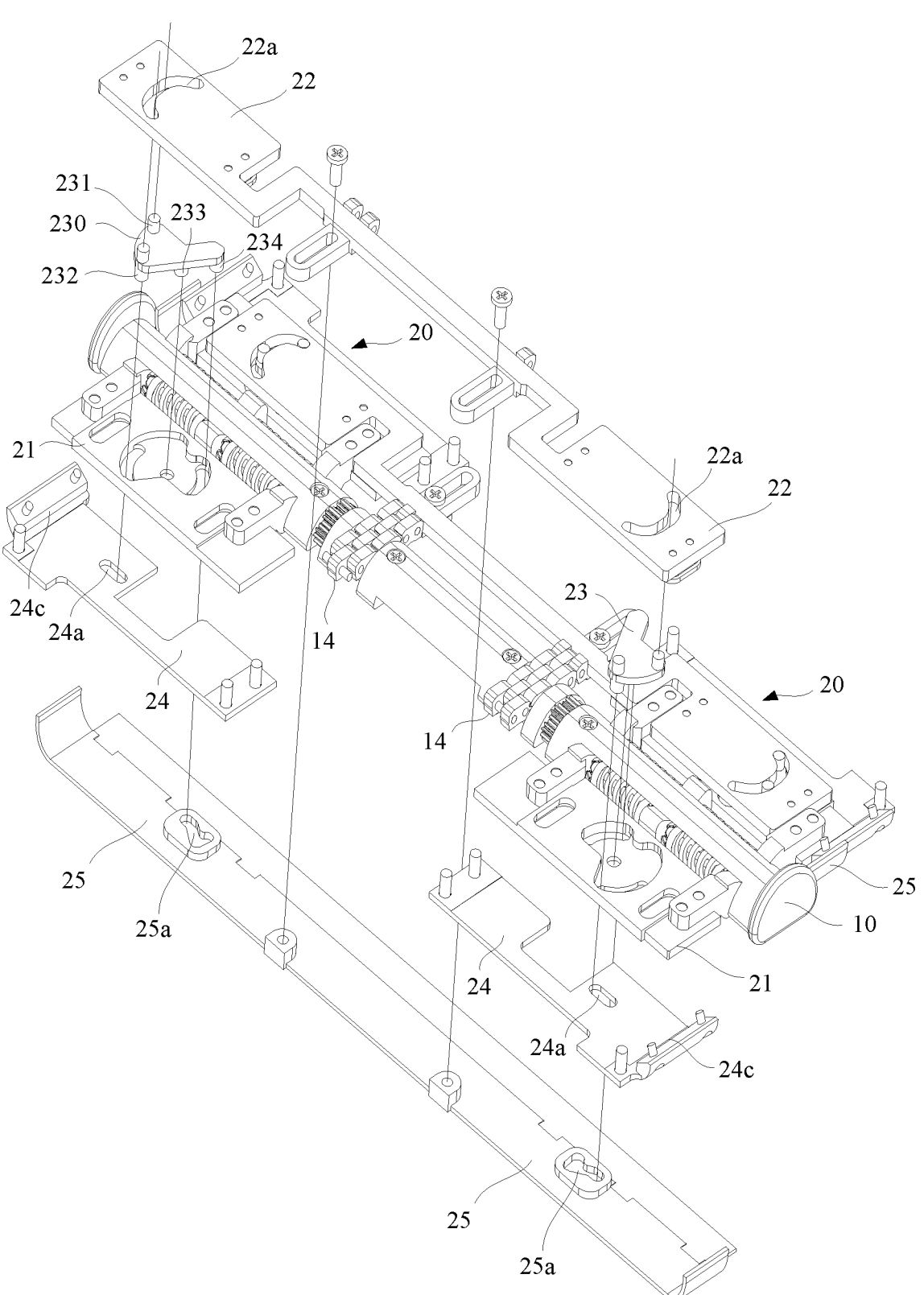
Figure 3:
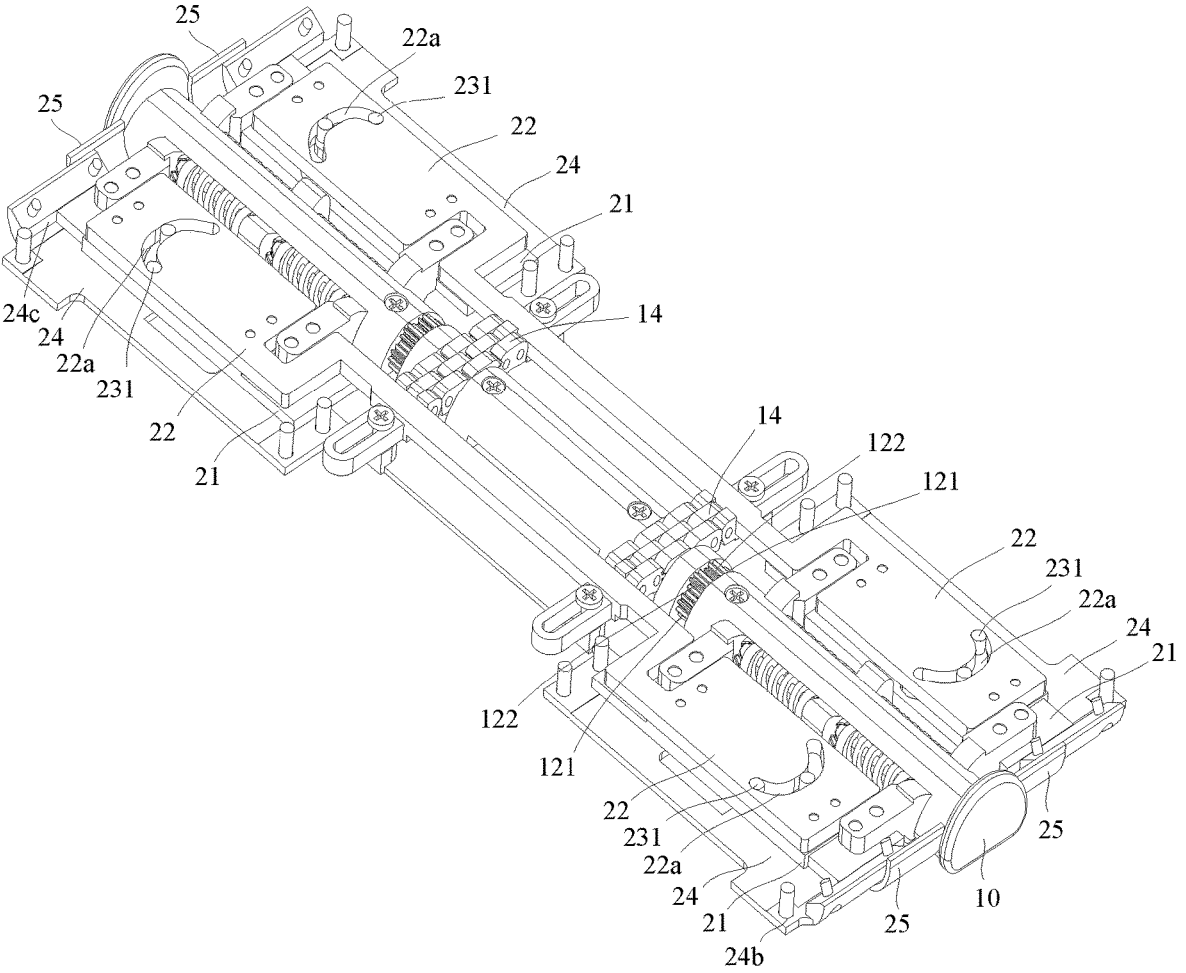
Figure 4:
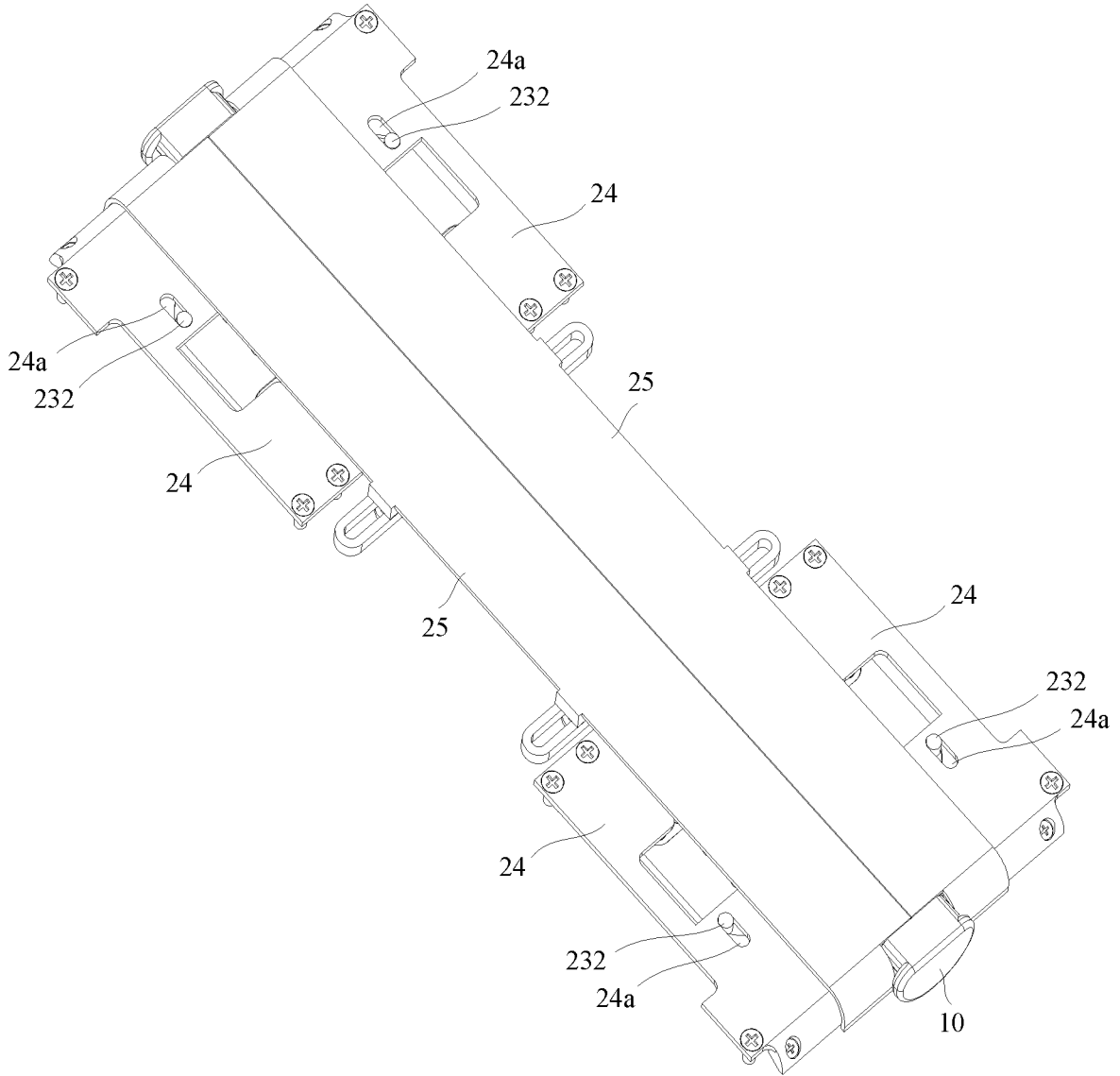
Figure 5:
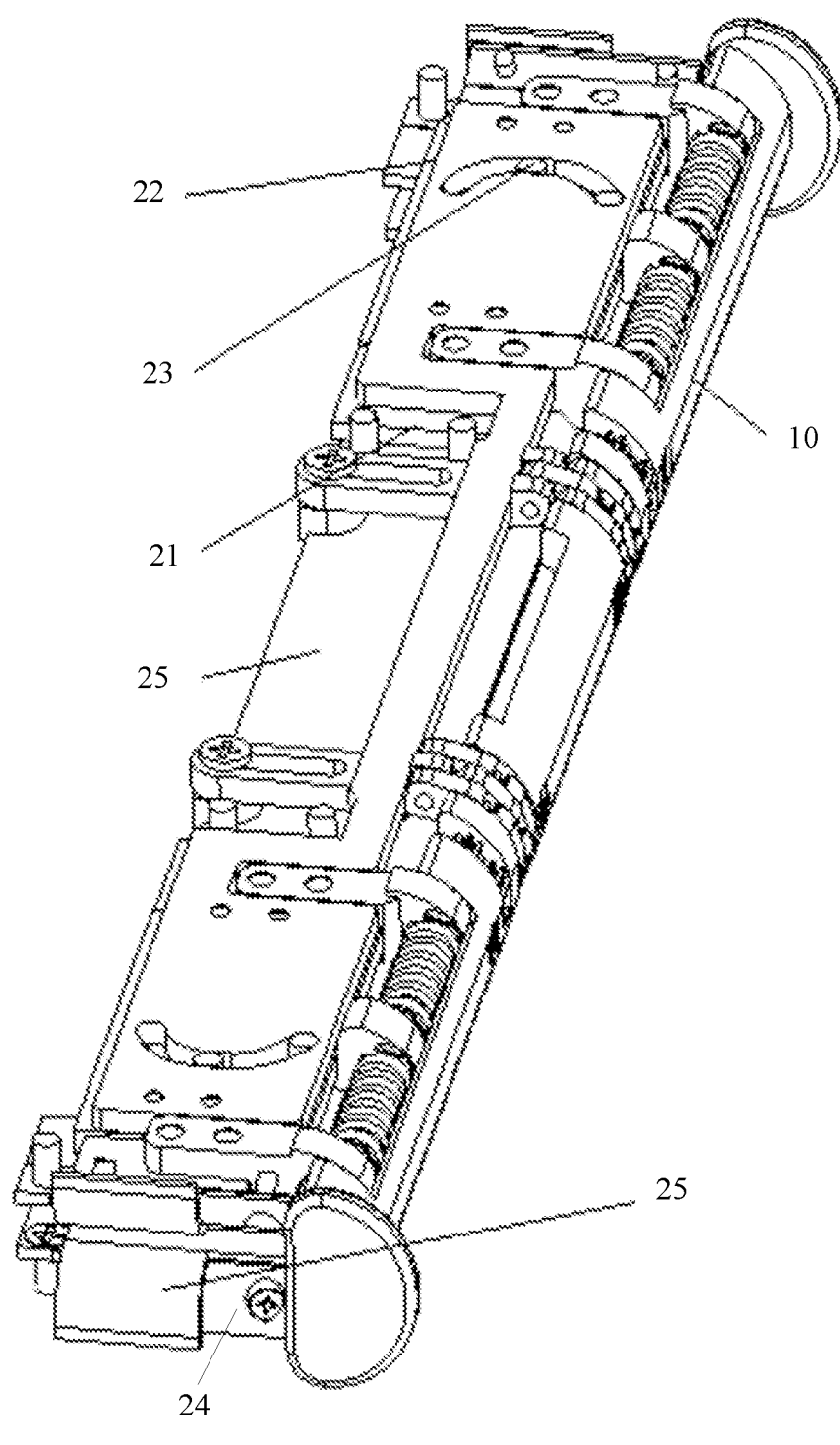
Figure 6:
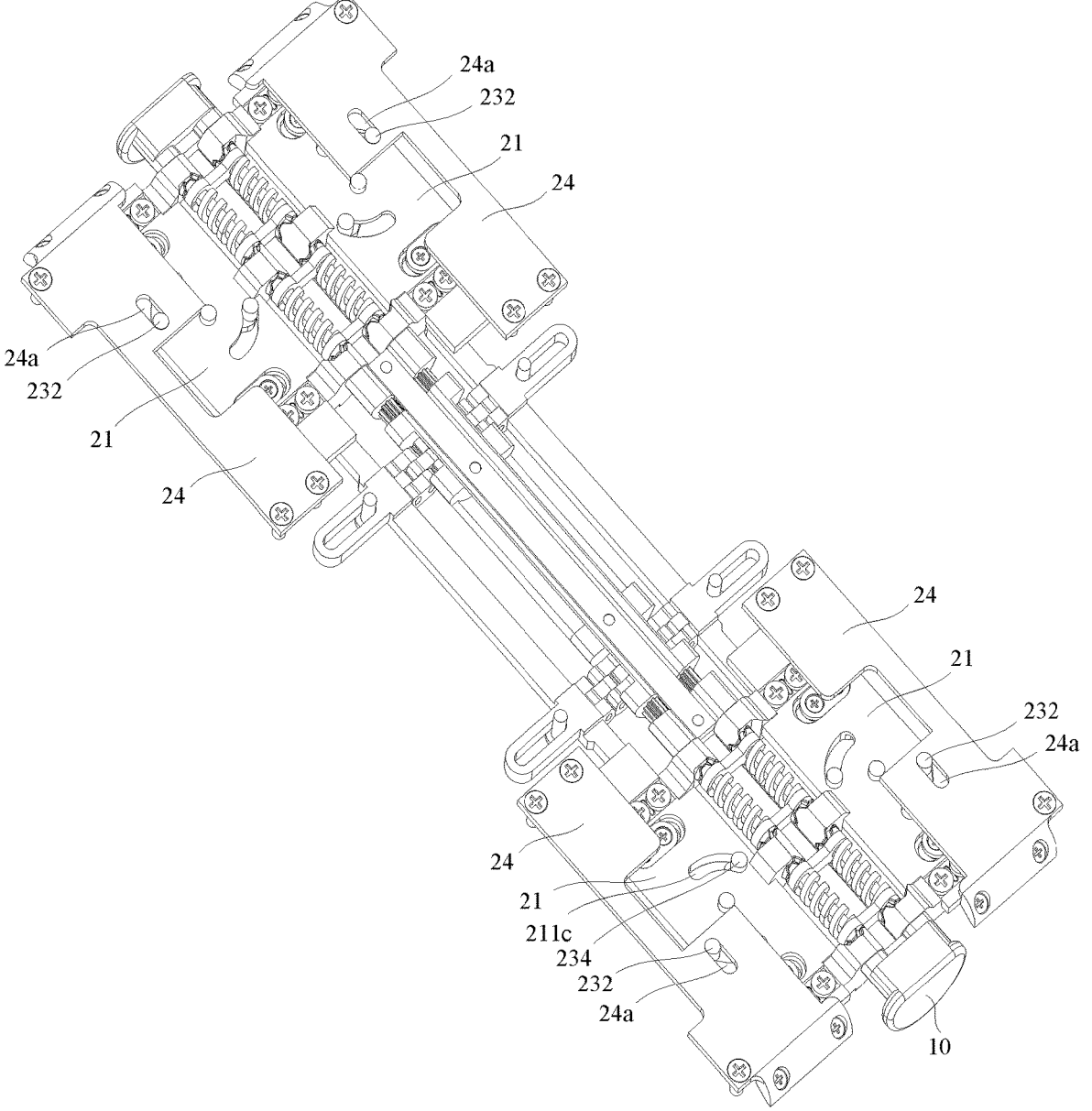
Figure 7:
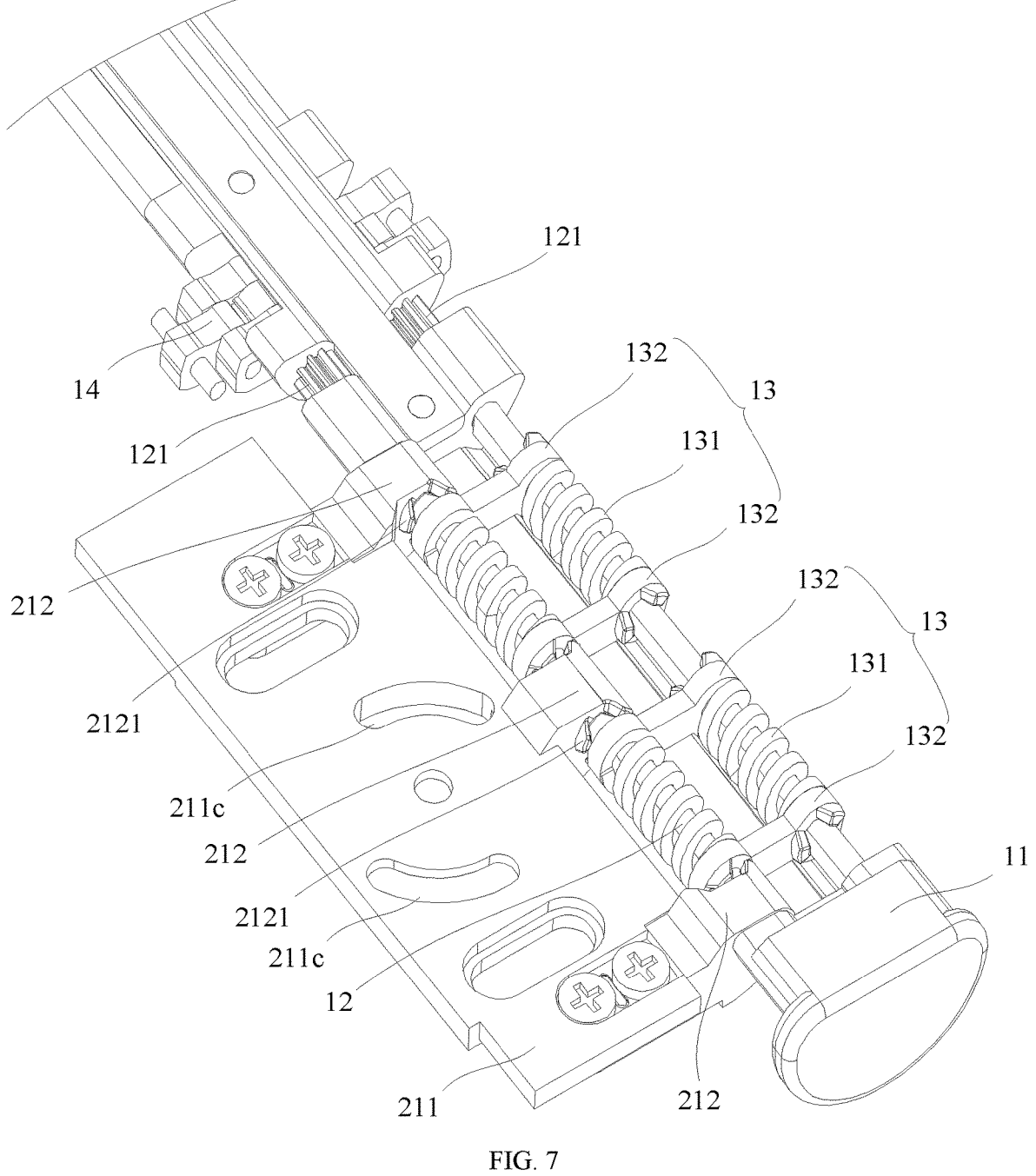
Figure 8:
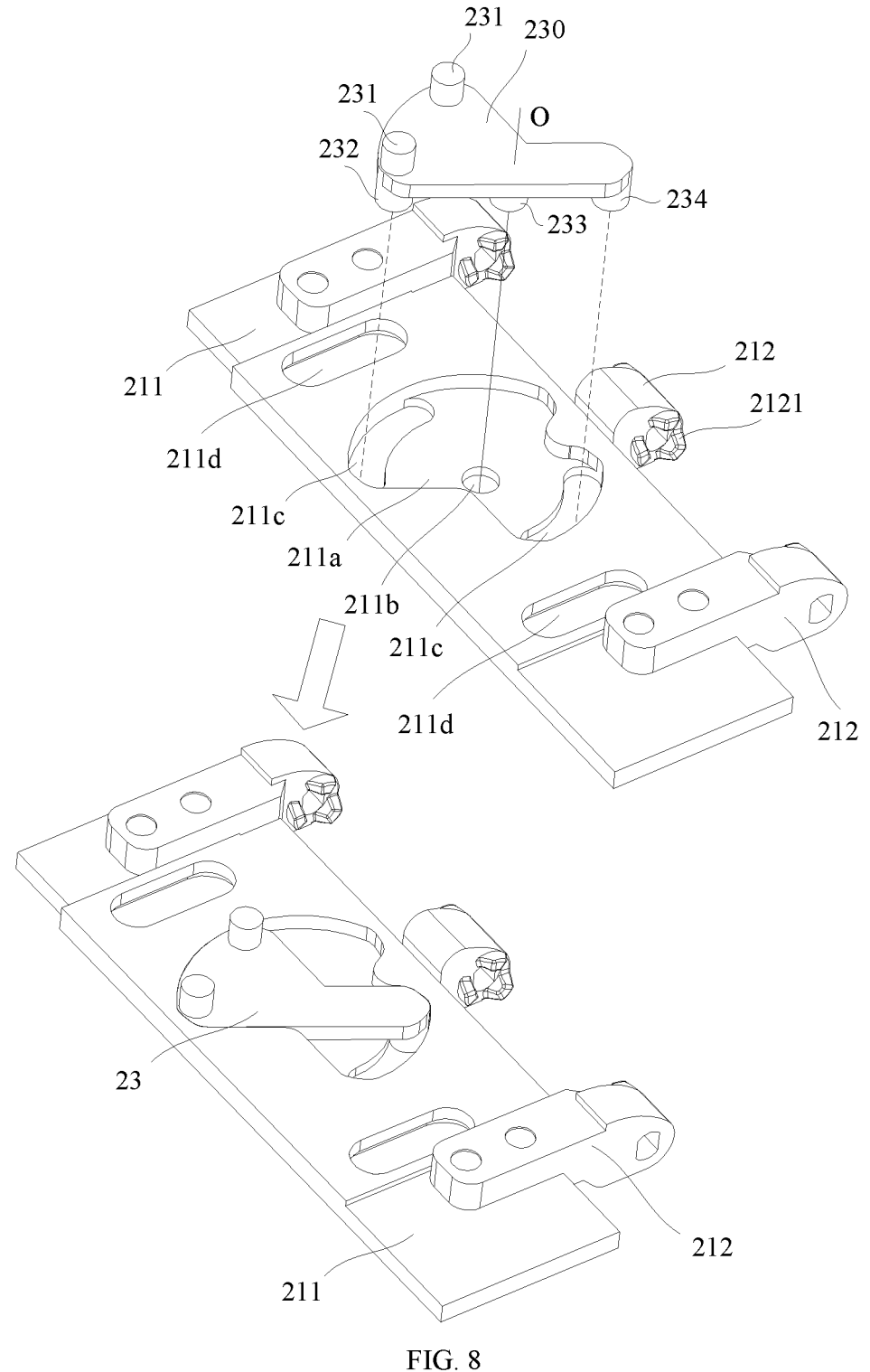
Figure 9:
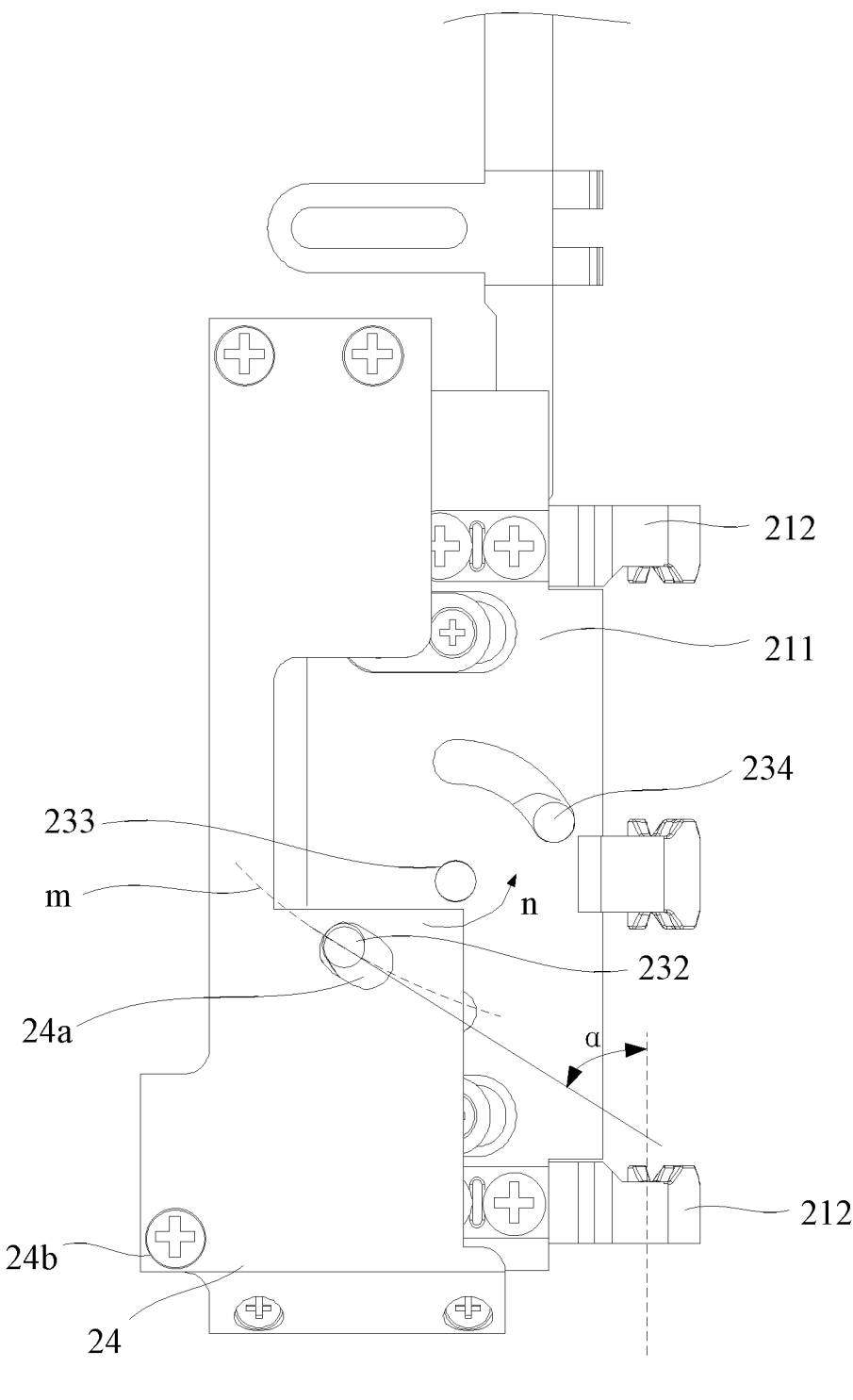
Figure 10:
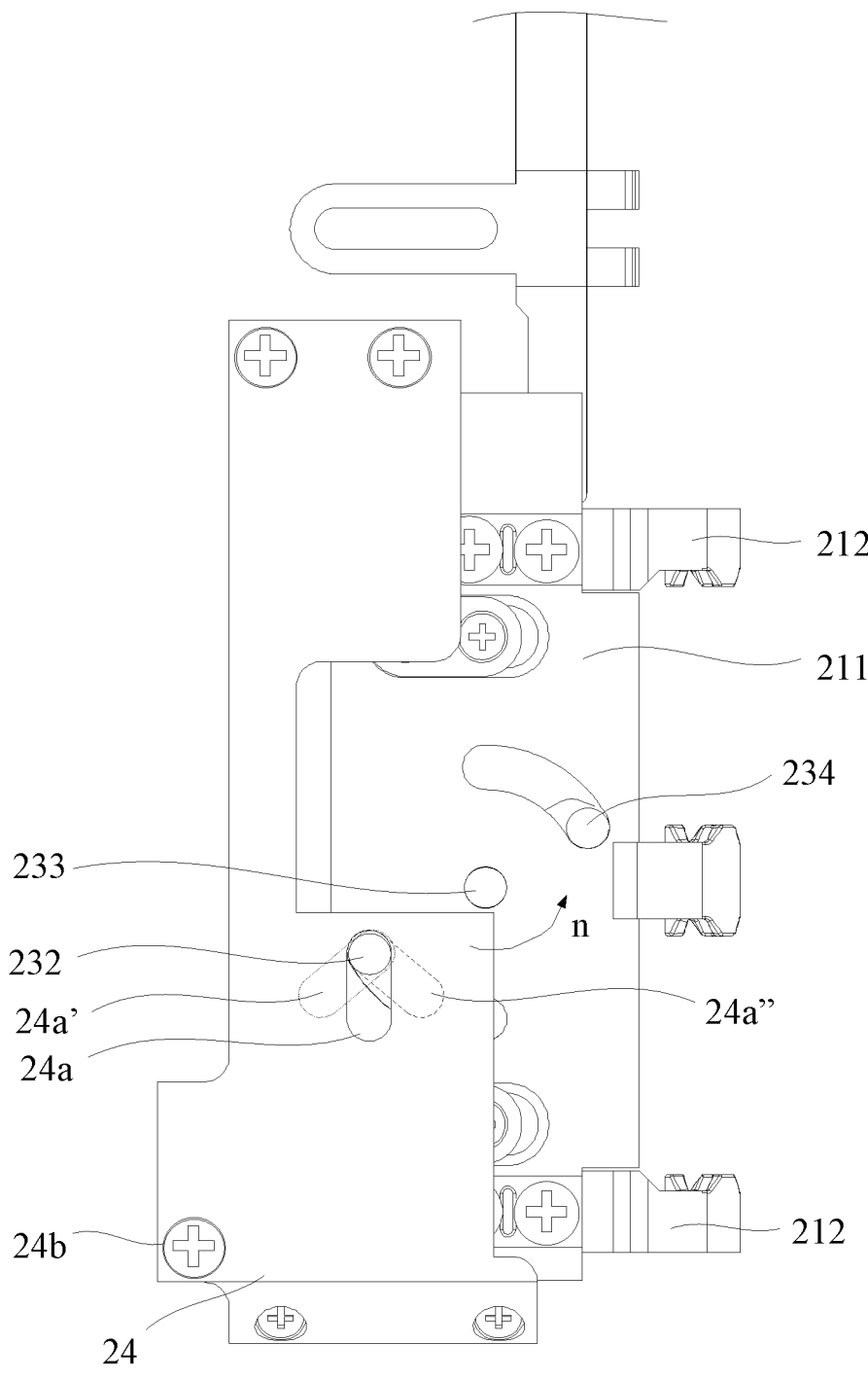
Figure 11:
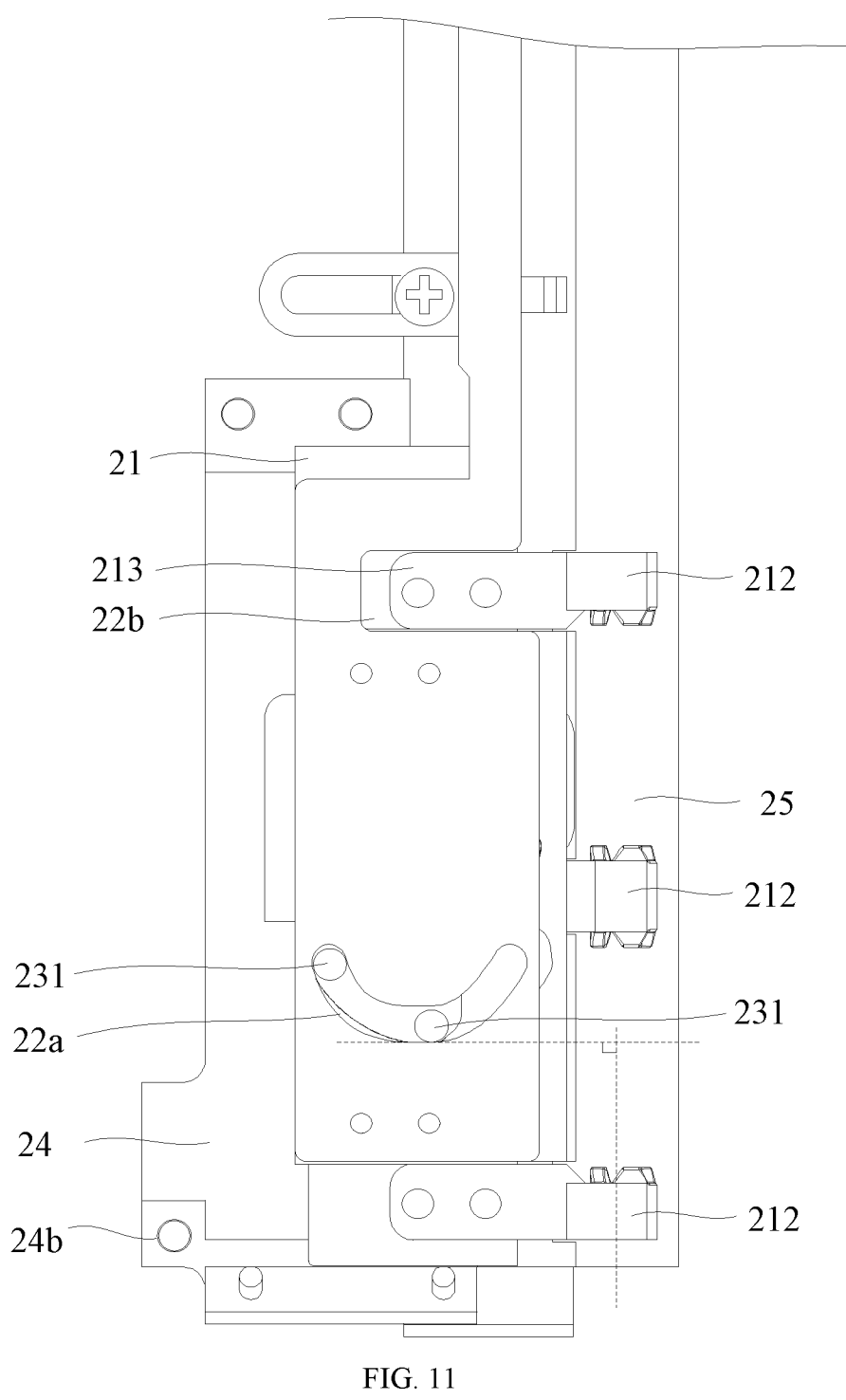
Figure 12:
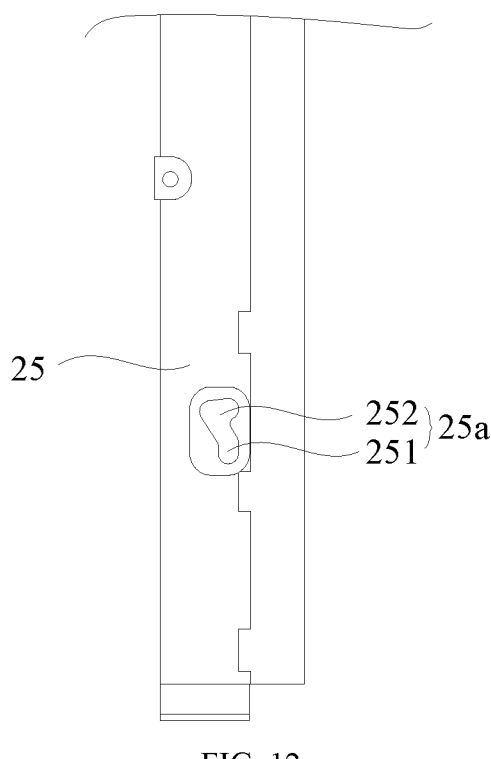
Figure 13:
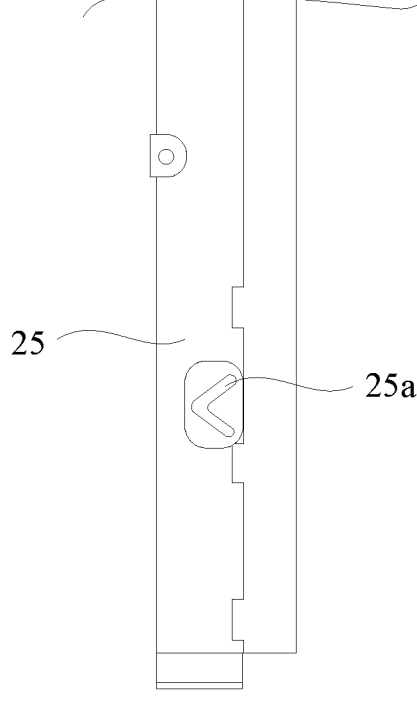
Figure 14:
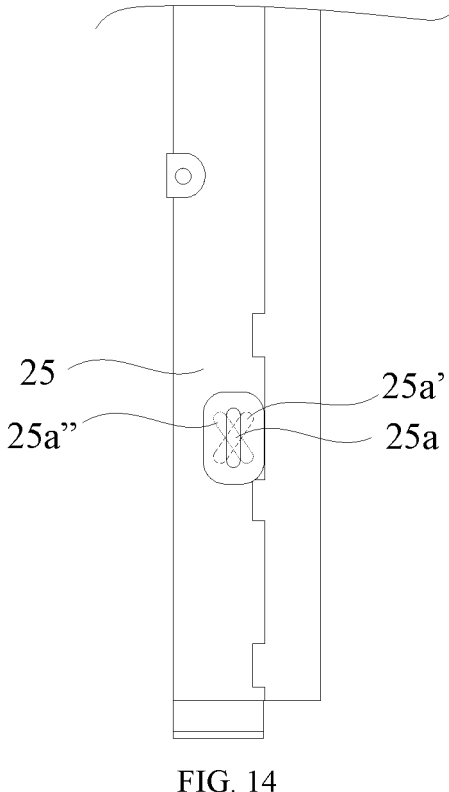
Figure 15:
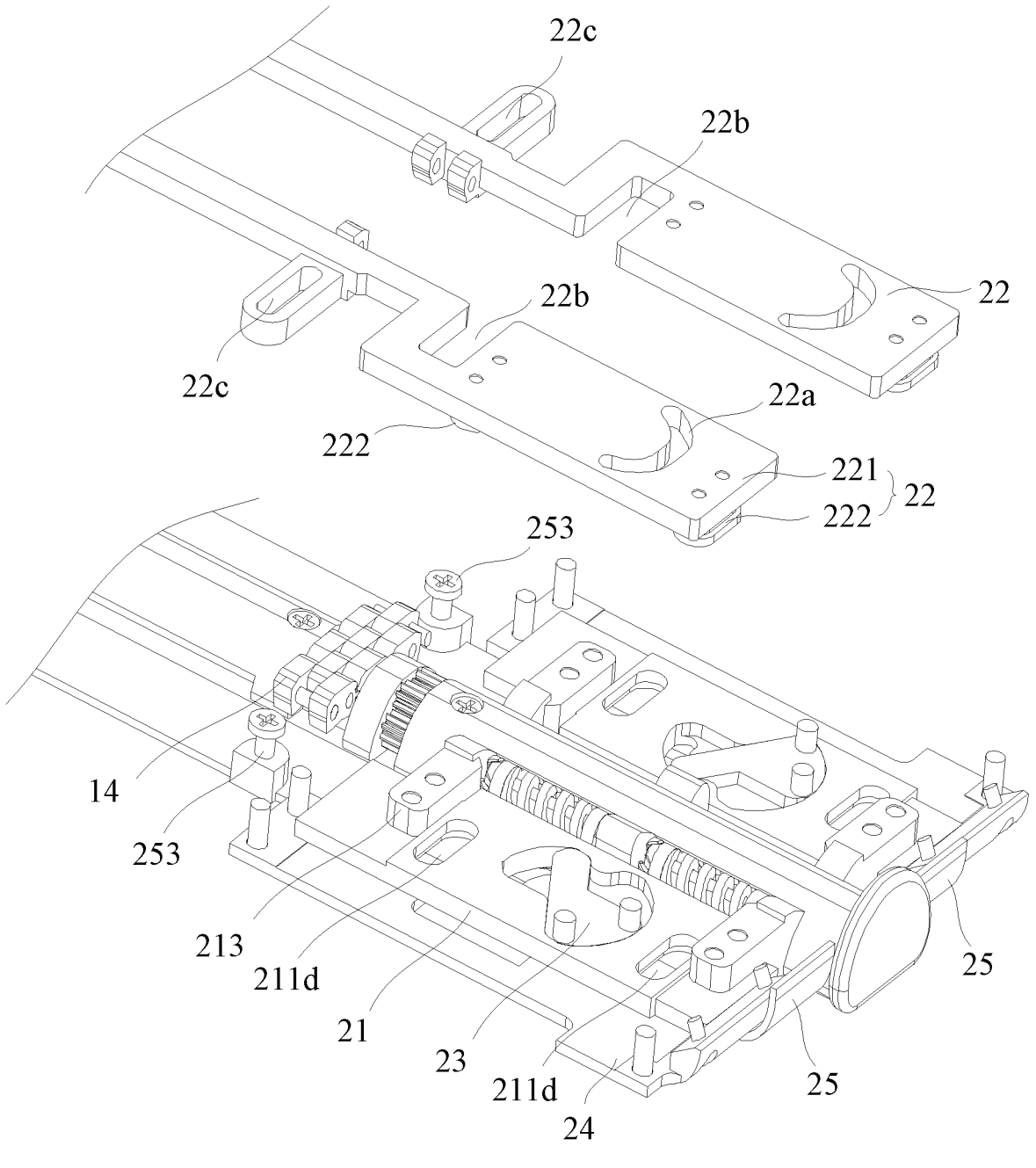
Figure 16:
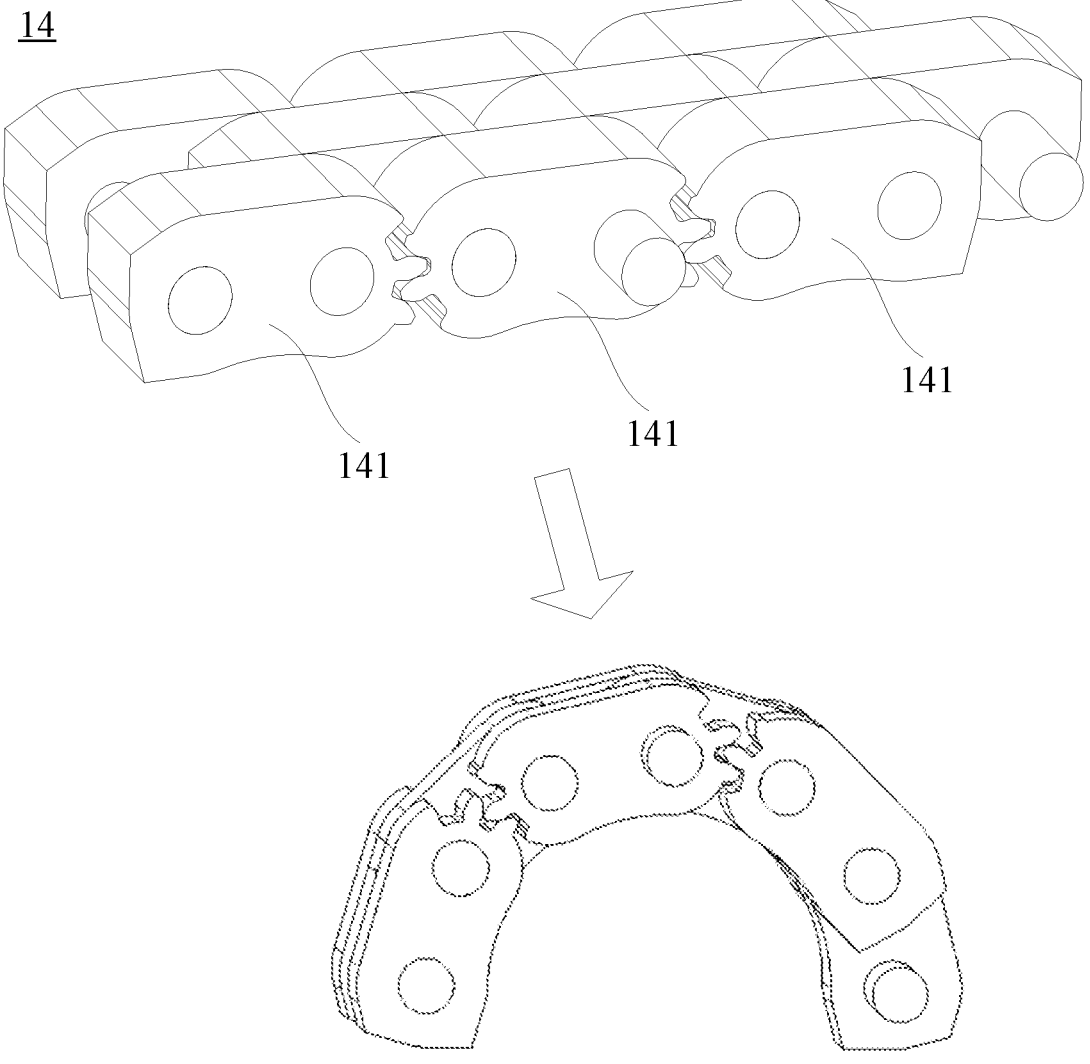
Figure 17:
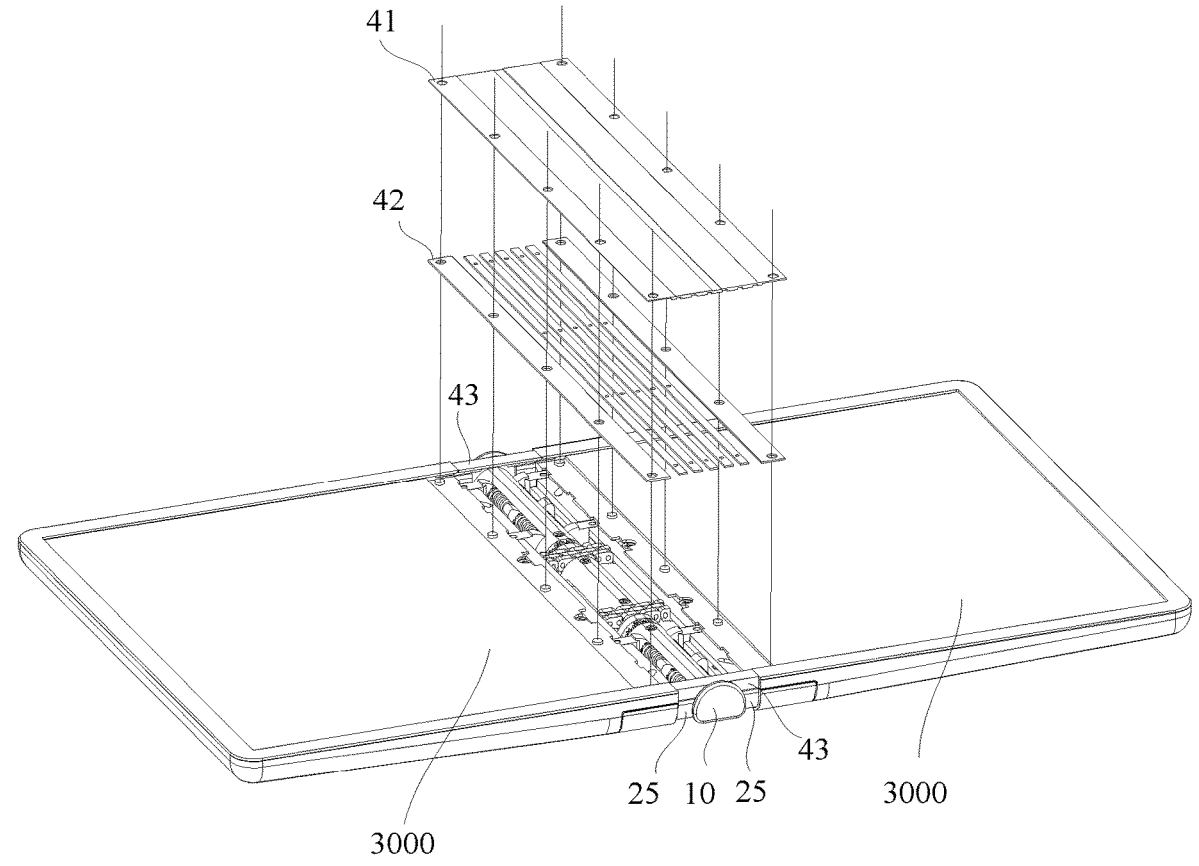
Figure 18:
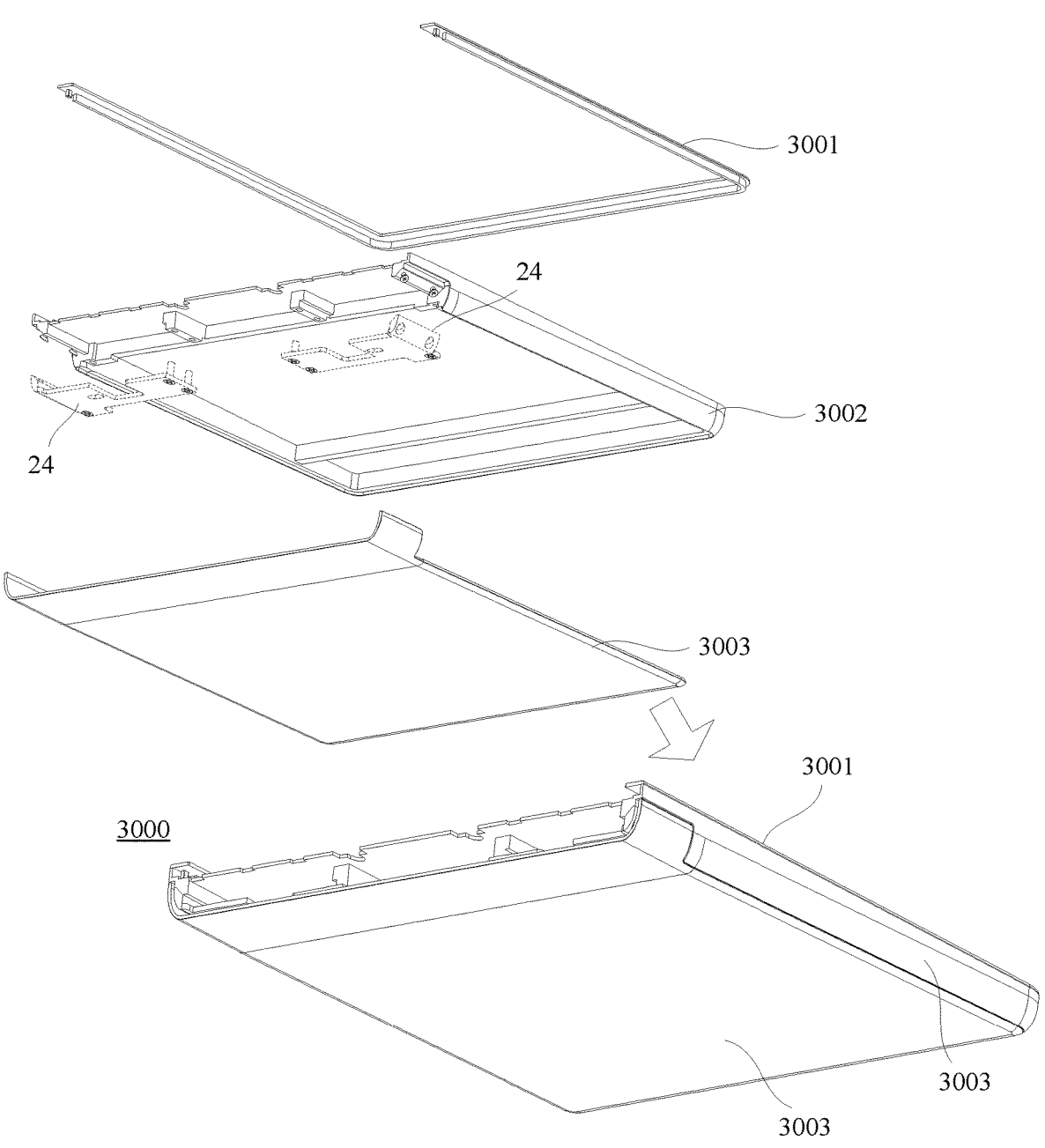

FIG. 1 is a schematic structural diagram of an electronic device according to some embodiments of the present disclosure;

FIG. 2 is a schematic structural diagram of a rotation shaft mechanism according to some embodiments of the present disclosure;

FIG. 3 is a schematic structural diagram of a rotation shaft mechanism in an unfolded state according to some embodiments of the present disclosure;

FIG. 4 is a schematic structural diagram of a rotation shaft mechanism in an unfolded state according to some embodiments of the present disclosure;

FIG. 5 is a schematic structural diagram of a rotation shaft mechanism in a folded state according to some embodiments of the present disclosure;

FIG. 6 is a schematic structural diagram of a rotation shaft mechanism in an unfolded state according to some embodiments of the present disclosure;

FIG. 7 is a schematic structural diagram of a base according to some embodiments of the present disclosure;

FIG. 8 is a schematic diagram of assembling a rotation plate and a linkage according to some embodiments of the present disclosure;

FIG. 9 is a schematic structural diagram of a support assembly according to some embodiments of the present disclosure;

FIG. 10 is a schematic structural diagram of a support assembly according to some embodiments of the present disclosure;

FIG. 11 is a schematic structural diagram of a support assembly according to some embodiments of the present disclosure;

FIG. 12 is a locally schematic structural diagram of a shutter plate according to some embodiments of the present disclosure;

FIG. 13 is a locally schematic structural diagram of a shutter plate according to some embodiments of the present disclosure;

FIG. 14 is a locally schematic structural diagram of a shutter plate according to some embodiments of the present disclosure;

FIG. 15 is a schematic diagram of assembling a slide plate and a rotation plate according to some embodiments of the present disclosure;

FIG. 16 is a schematic structural diagram of a connector according to some embodiments of the present disclosure;

FIG. 17 is a schematic structural diagram of an electronic device according to some embodiments of the present disclosure; and FIG. 18 is a schematic structural diagram of a housing according to some embodiments of the present disclosure.

DETAILED DESCRIPTION OF THE INVENTION

To make the objectives, technical solutions, and advantages of the present disclosure clearer, the embodiments of the present disclosure are further described in detail hereinafter with reference to the accompanying drawings.

Unless otherwise defined, technical or scientific terms used herein shall have ordinary meaning understood by persons of ordinary skill in the art to which the disclosure belongs. The terms "first," "second," "third," and the like used in the specification and claims of the present disclosure are not intended to indicate any order, quantity or importance, but are merely used to distinguish the different components. Similarly, the terms "one of," "one," and the like are not intended to represent number limitation, and are intended to represent at least one. The terms "comprise" or "include," and the like are used to indicate that the element or object preceding the terms covers the element or object following the terms and its equivalents, and shall not be understood as excluding other elements or objects. The terms "connect" or "connection" and the like are not intended to be limited to physical or mechanical connections, but may include electrical connections, either direct or indirect connection. The terms "on", "under", "left" and "right" are only used to indicate the relative positional relationship. When the absolute position of the described object changes, the relative positional relationship may change accordingly.

Outward fordable electronic devices generally include a flexible display panel, a rotation shaft mechanism, and two housings. The two housings are connected to two sides of the rotation shaft mechanism, and the flexible display panel is disposed on the two housings. The two housings are openable and closable relative to each other. In the case that the electronic device is in an unfolded state, the two housings are opened, and the flexible display panel is spread on the two housings and the rotation shaft mechanism. In the case that the electronic device is in a folded state, the two housings are closed, the flexible display panel is bent, and the two housings are disposed between two portions of the folded flexible display panel.

In the case that the electronic device is in the unfolded state, an inner structure of the rotation shaft mechanism is prone to being exposed, which affects appearance and facilitates damage of the rotation shaft mechanism.

FIG. 1 is a schematic structural diagram of an electronic device according to some embodiments of the present disclosure. As shown in FIG. 1, the embodiments of the present disclosure provide an electronic device. The electronic device is an outward fordable electronic device, and includes, but not limited to a mobile phone and a tablet compute. The embodiments of the present disclosure are illustrated by taking the mobile phone as an example. The electronic device includes a flexible display panel 1000, a rotation shaft mechanism 2000, and two housings 3000. The rotation shaft mechanism 2000 and the two housings 3000 are disposed on a same side of the flexible display panel 1000. The two housings 3000 are respectively disposed on two sides of the rotation shaft mechanism 2000, and are connected to the rotation shaft mechanism 2000. The two housings 3000 are also connected to the flexible display panel 1000. The two housings 3000 are openable and closable relative to each other, and drive the flexible display panel 1000 in opening and closing. In the case that the electronic device is in the unfolded state, the two housings 3000 are opened, and the flexible display panel 1000 is spread on the two housings 3000 and the rotation shaft mechanism 2000.

FIG. 2 is a schematic structural diagram of a rotation shaft mechanism according to some embodiments of the present disclosure. As shown in FIG. 2, the rotation shaft mechanism includes a base 10 and two support assemblies 20. The two support assemblies 20 are respectively connected to two sides of the base 10. The two support assemblies 20 are rotatable relative to the base 10, so as to achieve opening and closing of the two support assemblies 20 relative to each other.

One electronic device includes one, two, or two more rotation shaft mechanisms. In the case that the electronic device includes two rotation shaft mechanisms, for example, as shown in FIG. 2, the bases 10 of the two rotation shaft mechanisms are connected.

The support assembly 20 includes a rotation plate 21 and a shutter plate 25, and the rotation plate 21 is pivoted to the base 10.

The shutter plate 25 is disposed on a face of the rotation plate 21 and is slidable in a direction close to or away from the base 10 relative to the rotation plate 21, and an orthogonal projection of the base 10 on a plane of the shutter plate 25 is at least partially overlapped with the shutter plate 25 in the case that the rotation shaft mechanism is in an unfolded state.

FIG. 3 and FIG. 4 are schematic structural diagrams of a rotation shaft mechanism in an unfolded state according to some embodiments of the present disclosure. FIG. 3 shows a face, configured to support the flexible display panel, of the rotation shaft mechanism, FIG. 4 shows the other face of the rotation shaft mechanism. As shown in FIG. 3 and FIG. 4, in the case that the rotation shaft mechanism is in the unfolded state, the orthogonal projection of the base 10 on the plane of the shutter plate 25 is at least partially overlapped with the shutter plate 25, such that the shutter plate 25 blocks the structure of the base 10 and functions as a protection.

FIG. 5 is a schematic structural diagram of a rotation shaft mechanism in a folded state according to some embodiments of the present disclosure. As shown in FIG. 5, the shutter plate 25 is slidable in the direction close to or away from the base 10 relative to the rotation plate 21. In folding the rotation shaft mechanism, the shutter plate 25 slides in the direction away from the base 10, such that the base 10 is exposed, the shutter plates 25 of the two support assemblies 20 are prevented from being closer to affect each other, and the rotation shaft mechanism is folded successfully. The rotation shaft mechanism is blocked and protected by the shutter plate 25, such that the rotation shaft mechanism is prevented from being damaged, and a lifetime of the rotation shaft mechanism is prolonged.

FIG. 6 is a schematic structural diagram of a rotation shaft mechanism in an unfolded state according to some embodiments of the present disclosure. FIG. 6 shows a face, distal from the flexible display panel, of the rotation shaft mechanism, and the shutter plate 25 is omitted. Comparing with FIG. 4, it can be seen from FIG. 6 that the shutter plate 25 at least blocks the base 10 in the unfolded state.

As shown in FIG. 2, the support assembly 20 further includes a slide plate 22 and a linkage 23. The slide plate 22 is disposed on a face, distal from the shutter plate 25, of the rotation plate 21, and is slidable in the direction close to or away from the base 10 relative to the rotation plate 21.

The linkage 23 is disposed between the slide plate 22 and the shutter plate 25, and is in rotatable connection to the rotation plate 21. The linkage 23 is configured to link the slide plate 22 and the shutter plate 25.

In folding the rotation shaft mechanism, the slide plate 22 and the rotation plate 21 are slid relative to each other. By disposing the linkage 23, the linkage 23 is driven by the slide plate 22, such that the shutter plate 25 slides relative to the rotation plate 21.

As shown in FIG. 2, the support assembly 20 further includes a housing drive plate 24. The housing drive plate 24 is disposed between the rotation plate 21 and the shutter plate 25, and is slidable in the direction close to or away from the base 10 relative to the rotation plate 21. For example, as shown in FIG. 2 and FIG. 3, a face, proximal to the rotation plate 21, of the housing drive plate 24 is provided with a slide slot 24c, and the rotation plate 21 is disposed in the slide slot 24c, such that the housing drive plate 24 is slidable relative to the rotation plate 21. The linkage 23 is further configured to link the housing drive plate 24 and the slide plate 22.

The housing drive plate 24 is configured to be connected to the housing 3000. In folding the electronic device, the housing drive plate 24 slides in the direction close to or away from the base 10 relative to the rotation plate 21, such that the housing 3000 is driven to slide, and the flexible display panel 1000 is prevented from being greatly pulled and damaged in folding.

As shown in FIG. 2, the slide plate 22 is provided with a first drive slot 22a, and the shutter plate 25 is provided with a second drive slot 25a.

The linkage 23 includes a body 230, a first pin shaft 231, and a second pin shaft 234. The body 230 is in rotatable connection to the rotation plate 21, and the first pin shaft 231 and the second pin shaft 231 are respectively disposed on two sides of the body 230 and are respectively disposed in the first drive slot 22a and the second drive slot 25a.

In the case that the slide plate 22 slides relative to the rotation plate 21, the linkage 23 rotates by driving of the first drive slot 22a and the first pin shaft 231. In the case that the linkage 23 rotates, the shutter plate 25 slides relative to the rotation plate 21 by driving of the second pin shaft 234 and the second drive slot 25a.

As shown in FIG. 2, the housing drive plate 24 is provided with a third drive slot 24a. The linkage 23 further includes a third pin shaft 232. The third pin shaft 232 and the second pin shaft 234 are disposed on a same side of the body 230, and the third pin shaft 232 is disposed in the third drive slot 24a.

In the case that the linkage 23 rotates, the housing drive plate 24 rotates relative to the rotation plate 21 by driving of the third pin shaft 232 and the third drive slot 24a.

In some embodiments, shapes of the first drive slot 22a, the third drive slot 24a, and the second drive slot 25a are designed by simulating, such that the slide of the housing drive plate 24 and the shutter plate 25 meets design requirements.

In the case that the electronic device includes two rotation shaft mechanisms, for example, as shown in FIG. 2, in the two rotation shaft mechanisms, the two slide plates 22 on the same side of the base 10 are connected, and the two shutter plates 25 on the same side of the base 10 are connected. For convenient understanding of relationship between structures in the support assembly 20, FIG. 2 disassembles the support assembly 20 on a side of the base 10.

FIG. 7 is a schematic structural diagram of a base according to some embodiments of the present disclosure. For convenient description of matching of the base 10 and the rotation plate 21, FIG. 7 further shows a rotation plate 21. As shown in FIG. 7, the base 10 includes a mount 11 and two rotation shafts 12. The two rotation shafts 12 are disposed on the mount 11 in parallel and spaced apart from each other. The rotation plates 21 of the two support assemblies 20 are respectively connected to the two rotation shafts 12, such that the rotation plate 21 is rotatable against the axis of the rotation shaft 12.

An end portion of the rotation shaft 12 is coaxially connected to a first synchro gear 121. Referring to FIG. 3, the first synchro gears 121 of the two rotation shafts 12 are in drive connection by two second synchro gears 122, such that the two rotation shafts 12 rotate synchronously. A gear mounting slot is disposed on the mount 11, so as to accommodate the first synchro gears 121 and the second synchro gears 122.

The two support assemblies 20 are asymmetrically distributed about the base 10. Taking one of the support assembly 20 as an example, as shown in FIG. 7, the rotation plate 21 includes a first plate 211 and a plurality of connection arms 212. Illustratively, in the embodiments of the present disclosure, the rotation plate 21 includes three connection arms 212. The plurality of connection arms 212 protrudes relative to a same side of the first plate 211, and are connected to the first plate 211. An end, distal from the first plate 211, of the connection arm 212 is sleeved on the rotation shaft 12, and is circumferentially fixed with the rotation shaft 12, such that the rotation plate 21 and the rotation shaft 12 simultaneously rotates against the rotation shaft 12 in folding. That is, a rotation axis of the rotation plate 21 is a rotation axis of the rotation shaft 12. In circumferentially fixing, a cross-sectional shape of the rotation shaft 12 is the same as a cross-sectional shape of corresponding hole in the connection arm 212, for example, an arcuate shape. In the three connection arms 212, two side of a middle connection arm 212 are provided with a plurality of protrusions 2121, and sides, proximal to the middle connection arm 212, of the other two connection arms 212 are provided with a plurality of protrusions 2121.

The base 10 further includes a plurality of damping assemblies 13. Each damping assembly 13 includes an elastic member 131 and two end face cams 132. The end face cam 132 is sleeved on the rotation shaft 12, and the end face cam 132 and the rotation shaft 12 are rotatable relative to each other, and the end face cam 132 is axially slidable relative to the rotation shaft 12. The elastic member 131, for example, a spring, is sleeved on the rotation shaft 12, and is disposed between the two end face cams 132. The end face cam 132 is configured to match with the plurality of protrusions 2121 of the connection arm 212.

As shown in FIG. 7, the damping assembly 13 is disposed between two adjacent connection arms 212. The two end face cams 132 are matched with the plurality of protrusions 2121 of the two adjacent connection arms 212. In the case that the rotation plate 21 drives the rotation shaft 12 to rotate, the protrusion 2121 pushes the end face cam 132, such that the elastic member 131 deforms under the pressing to form the damping. In the case that the protrusion 2121 is disposed in a recess position of the end face cam 132, the rotation plate 21 keeps a current state under the elastic force of the elastic member 131 after a force for bending the electronic device is removed, so as to avoid autonomous flattening and closing of the electronic device.

FIG. 8 is a schematic diagram of assembling a rotation plate and a linkage according to some embodiments of the present disclosure. As shown in FIG. 8, the first plate 211 of the rotation plate 21 is provided with an accommodation recess 211a. The accommodation groove 211a is configured to accommodate the body 231 of the linkage 23. A bottom of the accommodation recess 211a is provided with a pin hole 211b, and the pin hole 211b is configured to be connected to the linkage 23, such that the linkage is rotatable against an axis of the pin hole 211b relative to the rotation plate 21. The axis of the pin hole 211b is the rotation axis of the body 230 of the linkage 23. Two arc escape recesses centered on the pin hole 211b are further disposed on two sides of the pin hole 211b at the bottom of the accommodation recess 211a.

In addition to accommodation recess 211a, the first plate 211 is also provided with two strip slide slots 211d disposed on two sides of accommodation recess 211a. An extension direction of the strip slot 211d is perpendicular to the rotation shaft 12, that is, perpendicular to the rotation axis of the rotation plate 21.

As shown in FIG. 8, the linkage 23 includes a body 230, a first pin shaft 231, a third pin shaft 232, a fourth pin shaft 233, and a second pin shaft 234. The body 230 is plate-shaped, the first pin shaft 231 is disposed on one face of the body 230, the third pin shaft 232, the fourth pin shaft 233, and the second pin shaft 234 are disposed on the other face of the body 230. The fourth pin disposed 233 is disposed in the middle of the body 230, and the third pin shaft 232 and the second pin shaft 234 are disposed on two sides of the fourth pin shaft 233.

In being assembled, the linkage 23 is matched with the rotation plate 21. Specifically, the body 230 of the linkage 23 is disposed in the accommodation recess 211a of the first plate 211, and the fourth pin shaft 233 is inserted in the pin hole 211b. The third pin shaft 232 and the second pin shaft 234 are respectively disposed in two escape recesses 211c at the bottom of the accommodation recess 211a. In the case that the linkage 23 rotates in the accommodation recess 211a by taking the fourth pin shaft 233 as the axis, the third pin shaft 232 and the second pin shaft 234 move in the two escape recesses 211c respectively.

In some embodiments, in the depth direction of the accommodation recess 211a, a thickness of the body 230 of the linkage 23 is not greater than a depth of the accommodation recess 211a, such that the body 230 is fully accommodated in the accommodation recess 211a, and the structure of the support assembly 20 is more compact. The third pin shaft 232 extends through the escape recess 211c to the other side of the first plate 211 to match with the third drive slot 24a of the housing drive plate 24. The second pin shaft 234 extends through the escape recess 211c to the other side of the first plate 211 to match with the second drive slot 25a of the shutter plate 25.

In some embodiments, a distance between the first pin shaft 231 and the rotation axis O of the body 230 is less than a distance between the third pin shaft 232 and the rotation axis O of the body 230.

The first pin shaft 231 is configured to match with the first drive slot 22a on the slide plate 22. In the case that the slide plate 22 moves relative to the rotation plate 21, the linkage 23 rotates by the driving of the first drive slot 22a and the first pin shaft 231, and the housing drive plate 24 rotates by the driving of the third pin shaft 232. The distance between the first pin shaft 231 and the rotation axis O of the body 230 is less, such that the linkage 23 functions as an amplification. In the case that the slide plate 22 moves the same distance, the less the distance between the first pin shaft 231 and the rotation axis O of the body 230, the greater the angle that the linkage 23 rotates, the greater the distance that the third pin shaft 232 moves, such that the distance that the housing drive plate 24 moves is greater. By adjusting a ratio of the distance between the first pin shaft 231 and the rotation axis O of the body 230 and the distance between the third pin shaft 232 and the rotation axis O of the body 230, in folding, the housing drive plate 24 is able to move a sufficient distance to prevent the flexible display panel from being pulled, and a central bulge of the flexible display panel caused by excessive moving distance of the housing drive plate 24 is avoided.

In some embodiments, the distance between the first pin shaft 231 and the rotation axis O of the body 230 is greater than or equal to the distance between the third pin shaft 232 and the rotation axis O of the body 230.

Similarly, the distance between the first pin shaft 231 and the rotation axis O of the body 230 is less than the distance between the second pin shaft 234 and the rotation axis O of the body 230, such that the shutter plate 25 moves a greater distance in folding the electronic device. In some embodiments, the distance between the first pin shaft 231 and the rotation axis O of the body 230 is greater than or equal to the distance between the second pin shaft 234 and the rotation axis O of the body 230. Providing a dimensional relationship of adjusting the distance between the first pin shaft 231 and the rotation axis O of the body 230 and the distance between the second pin shaft 234 and the rotation axis O of the body 230, the shutter plates 25 of the two support assemblies 20 form a sufficiently great blocking range for the base 10 in the case that the electronic device is in the unfolded state, and the shutter plates 25 of the two support assemblies 20 form a sufficiently great distance in the case that the electronic device is folded, so as to avoid interfering with folding of the electronic device caused by the interaction of the two shutter plates 25.

In some embodiments, the linkage 23 includes two first pin shafts 231, and the distance between the two first pin shafts 231 and the rotation axis O of the body 230 are equal. In the case that the first drive slot 22a is an arc slot, the two first pin shafts 231 are disposed in the first drive slot 22a.

In the case that the first drive slot 22a is provided as an arc slot, as the first pin shafts 231 are disposed in different positions, and the magnitudes of forces applied to the first pin shaft 231 by sidewalls of the arc slot are different, the forces applied to the linkage 23 by the slide plate 22 are not stable. By disposing two first pin shafts 231, both of the two first pin shafts 231 are subjected to the forces applied by the sidewalls of the arc slots. As a distance is present between the two first pin shafts 231, the forces are different, and the sum of the forces experienced by the two first pin shafts 231, that is, the force applied to the linkage 23 by the slide plate 22, is more stable.

Illustratively, by taking the rotation axis O of the body 230 of the linkage 23 as a center, the circumferential space between the two first pin shafts 231 is a half of the length of the first drive slot 22a. In the case that one first pin shaft 231 is disposed at an end of the first drive slot 22a, the other first pin shaft 231 is disposed at a middle of the first drive slot 22a. Thus, the force applied to linkage 23 by the sidewall of the arc slot is more stable in folding, and the linkage 23 moves more smoothly in sliding.

FIG. 9 is a schematic structural diagram of a support assembly according to some embodiments of the present disclosure. FIG. 9 shows a face, distal from the flexible display panel, of the support assembly, and the shutter plate 25 is omitted. As shown in FIG. 9, the housing drive plate 24 is disposed on a side, distal from the linkage 23, of the rotation plate 21. The edge of the housing drive plate 24 is provided with a plurality of connection holes 24b configured to be connected to the housing 3000. For example, a screw is provided in the connection hole 24b, and the housing drive plate 24 and a middle frame of the housing 3000 are connected by the screw.

As shown in FIG. 9, the third pin shaft 232 extends into the third drive slot 24a. At least one of the first drive slot 22a and the third drive slot 24a is an arc slot.

For example, the third drive slot 24a is an arc slot. In the case that the electronic device is folded, the linkage 23 rotates in a direction shown by the arrow n, and the third pin shaft 232 drives the housing drive plate 24 to move through the sidewall of the third drive slot 24a. The third pin shaft 232 also moves relative to the third drive slot 24a in moving, and the third pin shaft 232 has a motion component parallel to the rotation shaft 12 and a motion component perpendicular to the rotation shaft 12 relative to the third drive slot 24a. As the third drive slot 24a is an arc slot, the motion components of the two directions are varied, and the motion component perpendicular to the rotation shaft 12 affects the movement of the housing drive plate 24 in a direction close to or away from the base 10. Thus, the movement of the housing drive plate 24 in the direction close to or away from the base 10 is also varied. For example, the linkage 23 rotates the same angle in the same direction at different positions, and the housing drive plate 24 moves different distances relative to rotation plate 21. In the case that the rotation of the linkage 23 rotates uniformly, the movement of the housing drive plate 24 relative to the rotation plate 21 is non-uniform. By adjusting the arc slots, for example, adjusting curvatures of the different positions of the arc slots, the trajectory of the arc slots is adjusted, such that the movement of the housing drive plate 24 relative to the base 10 is more matched with the force experienced by the flexible display panel in folding the electronic device, such that during the folding process, the flexible display panel is minimized pulled in folding, and the bulge of the flexible display panel is avoided.

The extension direction of the third drive slot 24a is illustrated in FIG. 9 by a dashed line m, and the center portion of the third drive slot 24a bends towards a side distal from the rotation axis of the body 230 of the linkage 23. The rotation axis of the body 230 of the linkage 23 is also the axis of the fourth pin shaft 233 or the axis of the pin hole 211b.

The bending directions of the arc slot are different, which affects the movement of the housing drive plate 24. By bending the center portion of the arc slot towards the side distal from the rotation axis of the body 230, that is, making the arc slot protrude towards the side distal from the rotation axis of the body 230, the speed at which the housing drive plate 24 moves relative to the rotation plate 21 gradually increases in closing the two support assemblies 20. The speed herein refers to the distance that the housing drive plate 24 moves relative to the rotation plate 21 in the case that the rotation plate 21 rotates a unit angle. The gradual increase in speed indicates that a ratio of the distance that the housing drive plate 24 moves relative to the rotation plate 21 and the angle of rotation of the rotation plate 21 gradually increases. In this way, in folding from the unfolded state, the speed of the housing drive plate 24 is less at the start of folding to avoid the bulge of the flexible display panel, and then the speed of the housing drive plate 24 is gradually increased to prevent the flexible display panel from being pulled, thereby better matching the flexible display panel.

As shown in FIG. 9, the included angle α between the line of the two end of the arc slot and the rotation axis of the rotation plate 21 ranges from 50° to 80°.

The included angle between the extension direction of the drive slot and the rotation axis of the rotation plate 21 affects the speed of the housing drive plate 24 in folding. The included angle α ranges from 50° to 80°, such that the drive plate 24 is prevented from moving too quickly or too slowly in moving to match the flexible display panel greatly.

In some embodiments, one of the first drive slot 22a and the third drive slot 24a is a strip slot.

For example, FIG. 10 is a schematic structural diagram of a support assembly according to some embodiments of the present disclosure. FIG. 10 shows a face, distal from the flexible display panel, of the support assembly, and the shutter plate 25 is omitted. As shown in FIG. 10, the third drive slot 24*a* is a strip slot, and the extension direction of the strip slot is parallel to the rotation axis of rotation plate 21.

In the case that the slide plate 22 moves relative to the rotation plate 21, the first pin shaft 231 rotates by the driving of the first drive slot 22*a*, such that the linkage 23 is driven to rotate. The third pin shaft 232 of the linkage 23 is matched with the third drive slot 24*a* to drive the housing drive plate 24 to move. As the third drive slot 24*a* is a strip slot, and the extension direction is parallel to the rotation axis of the rotation plate 21, the movement speed of the housing drive plate 24 and the third pin shaft 232 in a direction perpendicular to the rotation axis of the rotation plate 21 is the same.

The structure of the strip slot is simple, and the design is simplified. In the case that the structure of the linkage 23 is determined, that is, the distance between the first pin shaft 231 and the rotation axis of the body 230 and the distance between the third pin shaft 232 and the rotation axis of the body 230 are determined, it is only necessary to adjust the shape of the first drive slot 22*a* of the slide plate 22, such that the movement process of the housing drive plate 24 is accurately adjusted. Thus, the movement of the housing drive plate 24 is more matched with the flexible display panel, which prevents the flexible display panel from being bulged or pulled.

In some embodiments, the included angle between the extension direction of the strip slot and the rotation axis of the rotation plate 21 is an acute angle, for example, the strip slot 24*a*' and the strip slot 24*a*" shown in FIG. 10, such that the speeds of the third pin shaft 232 and the housing drive plate 24 moving in the direction perpendicular to the rotation axis of the rotation plate 21 are not equal.

As shown in FIG. 10, for example, in the case that the housing drive plate 24 moves close to the base 10 relative to the rotation plate 21, the third pin shaft 232 moves relative to the housing drive plate 24 along the strip slot 24*a*' and the strip slot 24*a*", the third pin shaft 232 moves relative to the housing drive plate 24, components are present in the directions perpendicular to the rotation axis of the rotation plate 21 and parallel to the rotation axis of the rotation plate 21, and the two components are constant. The speed component of the third pin shaft 232 in the direction perpendicular to the rotation axis of the rotation plate 21 is the difference in speed of the third pin shaft 232 and the housing drive plate 24 in the direction perpendicular to the rotation axis of the rotation plate 21. In folding, in the case that the speed component of the third pin shaft 232 in the direction perpendicular to the rotation axis of the rotation plate 21 is directed to the base 10, the moving speed of the third pin shaft 232 in the direction perpendicular to the rotation axis of the rotation plate 21 is greater than the moving speed of the housing drive plate 24, such that the housing drive plate 24 moves at a less speed. In the case that the speed component of the third pin shaft 232 in the direction perpendicular to the rotation axis of the rotation plate 21 faces away from the base 10, the moving speed of the third pin shaft 232 in the direction perpendicular to the rotation axis of the rotation plate 21 is less than the moving speed of the housing drive plate 24, such that the housing drive plate 24 moves at a greater speed.

FIG. 11 is a schematic structural diagram of a support assembly according to some embodiments of the present disclosure. As shown in FIG. 11, the first drive slot 22*a* is an arc slot. The first drive slot 22*a* is provided as an arc slot, such that the speed difference of the first pin shaft 231 and the slide plate 22 in the direction perpendicular to the rotation axis of the rotation plate 21 varies. By adjusting the curvature of the different positions of the arc slots, the moving speed of the first pin shaft 231 is changed, the rotation speed of the linkage 23 is changed, and the moving speeds of the housing drive plate 24 and the shutter plate 25 is correspondingly adjusted.

As shown in FIG. 11, the tangent to the center position of the first drive groove 22*a* is perpendicular to the rotation axis of the rotation plate 21, such that the movement of the linkage 23 is smoother when the two first pin shafts 231 of the linkage 23 are matched with the first drive slot 22*a*.

In some embodiments, the first drive slot 22*a* and the third drive slot 24*a* are the arc slots. By providing both the first drive slot 22*a* and the third drive slot 24*a* as the arc slots, the shapes of the two drive slots are adjusted, such that the movement of the housing drive plate 24 is more matched with the flexible display panel to prevent the flexible display panel from being bulged or pulled.

FIG. 12 is a locally schematic structural diagram of a shutter plate according to some embodiments of the present disclosure. As shown in FIG. 12, the second drive slot 25*a* includes a strip portion 251 and a V-shaped portion 251. The V-shaped portion 251 is disposed on an end of the strip portion 251, and an end of the V-shaped portion 251 is connected to the one end of the strip portion 251. Illustratively, the extension direction of the strip portion 251 is parallel to the rotation axis of the rotation plate 21.

In the case that the rotation shaft mechanism is in the unfolded state, the second pin shaft 234 is disposed on one end, distal from the V-shaped portion 251, of the strip portion 251. In the case that the rotation shaft mechanism is in the folded state, the second pin shaft 234 is disposed on one end, distal from the strip portion 251, of the V-shaped portion 251. During folding, the linkage 23 rotates under the driving of the slide plate 22. When the second pin shaft 234 is matched with the strip portion 251, the shutter plate 25 is driven to move in a constant speed. When the second pin shaft 234 is matched with the V-shaped portion 251, the shutter plate 25 is driven to move in a changed speed. When the second pin shaft 234 moves in the two portions of the V-shaped portion 251, the moving speed of the shutter plate 25 is different.

FIG. 13 is a locally schematic structural diagram of a shutter plate according to some embodiments of the present disclosure. As shown in FIG. 13, the second drive slot 25*a* is a V-shaped slot in the shutter plate 25.

The second pin shaft 234 is disposed on one end of the V-shaped slot when the rotation shaft mechanism is in the unfolded state. The second pin shaft 234 is disposed on the other end of the V-shaped slot when the rotation shaft mechanism is in the folded state. During folding, the linkage 23 rotates under the driving of the slide plate 22. The second pin shaft 234 is matched with the V-shaped slot to drive the shutter plate 25 to move in the changed speed. When the second pin shaft 234 moves in two portions of the V-shaped slot, the moving speed of the shutter plate 25 is different.

FIG. 14 is a locally schematic structural diagram of a shutter plate according to some embodiments of the present disclosure. As shown in FIG. 14, in the shutter plate 25, the second drive slot 25*a* is a strip slot, and the extension direction of the strip slot is parallel to the rotation axis of the rotation plate 21. The included angle between the extension direction of the strip slot and the rotation axis of the rotation plate 21 is an acute angle, for example, the strip slot 25*a*' and the strip slot 25*a*" in FIG. 14.

When the rotation shaft mechanism is in the unfolded state, the second pin shaft 234 is disposed on one end of the strip slot. When the rotation shaft mechanism is in the folded state, the second pin shaft 234 is disposed on the other end of the strip slot. During folding, the linkage 23 rotates under the driving of the slide plate 22, and the second pin shaft 234 is matched with the strip slot to drive the shutter plate 25 to move in the constant speed.

When the extension direction of the strip slot is parallel to the rotation axis of the rotation plate 21, the slide plate 22 drives the linkage 23 to rotate, the linkage 23 drives the shutter plate 25 to slide relative to the rotation plate 21 by the second pin shaft 234, and the moving speed of the shutter plate 25 in the direction perpendicular to the rotation axis of the rotation plate 21 is the same as the moving speed of the second pin shaft 234 in the direction perpendicular to the rotation axis of the rotation plate 21.

When the included angle is present between the extension direction of the strip slot and the rotation axis of the rotation plate 21, the slide plate 22 drives the linkage 23 to rotate, and the linkage 23 drives the shutter plate 25 to slide relative to the rotation plate 21 by the second pin shaft 234. The second pin shaft 234 moves relative to the shutter plate 25, and the second pin shaft 234 has the motion components in the directions parallel to the rotation axis of the rotation plate 21 and perpendicular to the rotation axis of the rotation plate 21, and the dimensions of the two components are constant. The speed component of the second pin shaft 234 in the direction perpendicular to the rotation axis of the rotation plate 21 is the difference in speed of the second pin shaft 234 and the shutter plate 25 in the direction perpendicular to the rotation axis of the rotation plate 21.

In folding, in the case that the speed component of the second pin shaft 234 in the direction perpendicular to the rotation axis of the rotation plate 21 is directed to the base 10, the moving speed of the second pin shaft 234 in the direction perpendicular to the rotation axis of the rotation plate 21 is greater than the moving speed of the shutter plate 25, such that the shutter plate 25 moves at a less speed. In the case that the speed component of the second pin shaft 234 in the direction perpendicular to the rotation axis of the rotation plate 21 is directed to the base 10, the moving speed of the second pin shaft 234 in the direction perpendicular to the rotation axis of the rotation plate 21 is less than the moving speed of the shutter plate 25, such that the shutter plate 25 moves at a greater speed.

FIG. 15 is a schematic diagram of assembling a slide plate and a rotation plate according to some embodiments of the present disclosure. As shown in FIG. 15, the slide plate 22 includes a second plate 221 and two slide plates 222, and the two slide plates 222 are disposed on a face, proximal to the rotation plate 21, of the second plate 221. The first drive slot 22a is disposed between the two slide plates 222. The two slide plates 222 are respectively disposed in two strip slide slots 211d on the first plate 211 of the rotation plate 21.

As the extension direction of the strip slide slot 211d is perpendicular to the rotation shaft 12, that is, perpendicular to the rotation axis of the rotation plate 21, the slide plate 222 only moves in the direction perpendicular to the rotation axis of the rotation plate 21 in the strip slide slot 211d, such that the moving direction of the slide plate 22 relative to the rotation plate 21 is limited.

In some embodiments, the slide plate 22 is also provided with a second guide slot 22b that extends from one side of the slide plate 22 proximal to the base 10 to the other side. The face, proximal to the slide plate 22, of the rotation plate 21 is provided with a protrusion block 213, and the protrusion block 213 is disposed in the second guide slot 22b.

The protrusion block 213 is matched with the second guide slot 22b, and is also capable of limiting the moving direction of the slide plate 22 relative to the rotation plate 21.

As shown in FIG. 15, the slide plate 22 is also provided with a first guide slot 22c. The extension direction of the first guide slot 22c is perpendicular to the rotation axis of the rotation plate 21. A face, proximal to the slide plate 22, of the shutter plate 25 is connected to a guide protrusion 253, and the guide protrusion 253 is disposed in the first guide slot 22c.

Illustratively, the guide protrusion 253 is a screw.

The guide protrusion 253 is matched with the first guide slot 22c to limit the moving direction of the shutter plate 25, such that the movement of the shutter plate 25 is more stable.

As shown in FIG. 15, the base 10 further includes a connector 14. A center portion of the connector 14 is connected to the mount 11, and two ends of the connector 14 extend to both sides of the mount 11. The two ends of the connector 14 bend relative to the mount 11. The two ends of the connector 14 are respectively connected to the slide plates 22 of the two support assemblies 20. For example, the end of the connector 14 is hinged to the side, proximal to the base 10, of the slide plate 22. An ear plate is disposed on the side, proximal to the base 10, of the slide plate 22 to facilitate connection to the connector 14.

In closing the two support assemblies 20, the rotation plate 21 rotates about the axis of the rotating shaft 12, the slide plate 22 rotates with the rotation plate 21, the slide plate 22 also moves in the direction close to the base 10 relative to the rotation plate 21 due to being pulled by the connector 14, such that the linkage 23 is driven to rotate, the third pin shaft 232 of the linkage 23 drives the housing drive plate 24 to move towards the direction proximal to the base 10, and the second pin shaft 234 of the linkage 23 drives the shutter plate 25 to move towards the direction proximal to the base 10.

FIG. 16 is a schematic structural diagram of a connector according to some embodiments of the present disclosure. As shown in FIG. 16, the connector 14 is a chain. The chain includes a plurality of links 141. An edge of the link 141 is provided with teeth, and the teeth of adjacent links 141 are engaged.

By engaging the links 141 by the teeth, the links 141 are simultaneously movable, such that the chain is prevented from being caked to damage the flexible display panel.

FIG. 17 is a schematic structural diagram of an electronic device according to some embodiments of the present disclosure. As shown in FIG. 17, the electronic device further includes an isolation structure. The isolation structure is disposed on a face, configured to support the flexible display panel, of the rotation shaft mechanism. The isolation structure includes a flexible support pad 41, a plurality of first support strips 42, and two second support strips 43.

The flexible support pad 41 is disposed on the face, configured to support the flexible display panel, of the rotation shaft mechanism. Two sides of the flexible support pad 41 are respectively connected to the two housings 3000.

The plurality of first support strips 42 are disposed on a face, proximal to the rotation shaft mechanism, of the flexible support pad 41 and are spaced apart in parallel, and the first support strip 42 is parallel to the rotation axis of the rotation plate 21.

The two second support strips 43 are respectively disposed on two ends of the base 10, and two ends of the second support strip 43 are respectively connected to the two housings 3000.

In some embodiments, the flexible support pad 41 is a rubber pad. The first support strip 42 is a metal member, such as a steel strip. The second support strip 43 is a flexible member, such as a rubber strip. Thus, the flexible support pad 41 and the second support strip 43 bend smoothly in folding. The first support strip 42 is provided as a metal piece to prevent the flexible support pad 41 from collapsing.

The isolation structure functions to separate the flexible display panel and the rotation shaft mechanism, so as to prevent the rotation shaft mechanism from damaging the flexible display panel in moving, and support the flexible display panel to keep the flexible display panel flat when deployed.

FIG. 18 is a schematic structural diagram of a housing according to some embodiments of the present disclosure. As shown in FIG. 18, the housing 3000 includes a front frame 3001, a middle frame 3002, and a rear housing 3003. The front frame 3001 and rear housing 3003 are disposed on opposite faces of the middle frame 3002, and are connected to the middle frame 3002. The flexible display panel 1000 is disposed between the front frame 3001 and the middle frame 3002, the front frame 3001 blocks the edges of the flexible display panel 1000 for protection. The middle frame 3002 is configured to support the flexible display panel 1000. The middle frame 3002 is also configured to be connected to the housing drive plate 24, such that the housing 3000 moves by the driving of the housing drive plate 24. The space between the rear housing 3003 and the middle frame 3002 is configured to accommodate the electronic device, such as a circuit board or the like. Other structure may also be accommodated. For example, FIG. 18 shows the housing drive plate 24 by a dashed line, the housing drive plate 24 is disposed between middle frame 3002 and rear housing 3003 when the housing drive plate 24 and housing 3000 are connected. In addition, in the unfolded state, the shutter plate 25 protrudes relative to the housing 3000, and in the folded state, the shutter plate 25 moves in the direction away from the base 10 to enter into the middle frame 3002 and the rear housing 3003.

Described above are merely some optional embodiments of the present disclosure, and are not intended to limit the present disclosure. Any modifications, equivalents, improvements, and the like, within the spirit and principle of the present disclosure, are intended to be included within the scope of the present disclosure.

The invention claimed is:

1. A rotation shaft mechanism, comprising: a base and two support assemblies;

wherein the two support assemblies are respectively connected to two sides of the base, and the support assembly comprises a rotation plate and a shutter plate, wherein the rotation plate is pivoted to the base, the shutter plate is arranged adjacent to the rotation plate and is slidable relative to the rotation plate along a radial direction of the base, and the shutter plate covers the base in response to that the rotation shaft mechanism is in an unfolded state; and the support assembly further comprises a slide plate and a linkage; wherein the slide plate is disposed on a face, distal from the shutter plate, of the rotation plate, and is slidable in the direction close to or away from the base relative to the rotation plate; and the linkage is disposed between the slide plate and the shutter plate, is in rotatable connection to the rotation plate, and is configured to link the slide plate and the shutter plate; wherein a face, proximal to the slide plate, of the rotation plate is provided with a protrusion block; and the slide plate is provided with a second guide slot, wherein the second guide slot extends from one side, proximal to the base, of the slide plate to the other side, and the protrusion block is disposed in the second guide slot.

2. The rotation shaft mechanism according to claim 1, wherein the slide plate is provided with a first drive slot, the shutter plate is provided with a second drive slot, and the linkage comprises a body, a first pin shaft, and a second pin shaft, wherein the body is in rotatable connection to the rotation plate, and the first pin shaft and the second pin shaft are respectively disposed on two sides of the body and are respectively disposed in the first drive slot and the second drive slot.

3. The rotation shaft mechanism according to claim 2, wherein the second drive slot is a strip slot, and an extension direction of the strip slot is parallel to a rotation axis of the rotation plate, or an included angle between the extension direction of the strip slot and the rotation axis of the rotation plate is an acute angle.

4. The rotation shaft mechanism according to claim 2, wherein the second drive slot is a V-shaped slot, or the second drive slot comprises a strip portion and a V-shaped portion, wherein the V-shaped portion is disposed on an end of the strip portion, and an end of the V-shaped portion is connected to the end of the strip portion.

5. The rotation shaft mechanism according to claim 2, wherein the first drive slot is an arc slot, and the linkage comprises two first pin shafts, wherein distances between the two first pin shafts and a rotation axis of the body are equal, and the two first pin shafts are disposed in the first drive slot.

6. The rotation shaft mechanism according to claim 1, wherein the slide plate is further provided with a first guide slot, wherein an extension direction of the first guide slot is perpendicular to a rotation axis of the rotation plate, a face, proximal to the slide plate, of the shutter plate is connected to a guide protrusion, and the guide protrusion is disposed in the first guide slot.

7. The rotation shaft mechanism according to claim 2, wherein the support assembly further comprises a housing drive plate, wherein the housing drive plate is disposed between the rotation plate and the shutter plate, is slidable in the direction close to or away from the base relative to the rotation plate, and is provided with a third drive slot; and the linkage further comprises a third pin shaft, wherein the third pin shaft and the second pin shaft are disposed on a same side of the body, and the third pin shaft is disposed in the third drive slot.

8. The rotation shaft mechanism according to claim 7, wherein at least one of the first drive slot and the third drive slot is an arc slot.

9. The rotation shaft mechanism according to claim 8, wherein a center portion of the arc slot bends towards a side away from a rotation axis of the body.

10. The rotation shaft mechanism according to claim 7, wherein one of the first drive slot and the third drive slot is a strip slot, and an extension direction of the strip slot is parallel to a rotation axis of the rotation plate, or an included angle between the extension direction of the strip slot and the rotation axis of the rotation plate is an acute angle.

11. The rotation shaft mechanism according to claim 1, wherein the base comprises a mount and a connector, wherein a center portion of the connector is connected to the mount, two ends of the connector respectively extend in two sides of the mount, are bendable relative to the mount, and are respectively connected to the slide plates of the two support assemblies.

12. The rotation shaft mechanism according to claim 11, wherein the connector is a chain, wherein the chain comprises a plurality of links, an edge of each of the links being provided with teeth, the teeth of adjacent links being engageable.

13. An electronic device, comprising: two housings and a rotation shaft mechanism, wherein the rotation shaft mechanism comprises: a base and the two support assemblies;

wherein the two support assemblies are respectively connected to two sides of the base, and the support assembly comprises a rotation plate and a shutter plate, wherein the rotation plate is pivoted to the base, the shutter plate is arranged adjacent to the rotation plate and is slidable relative to the rotation plate along a radial direction of the base, and the shutter plate covers the base in response to that the rotation shaft mechanism is in an unfolded state; and the support assembly further comprises a slide plate and a linkage; wherein the slide plate is disposed on a face, distal from the shutter plate, of the rotation plate, and is slidable in the direction close to or away from the base relative to the rotation plate; and the linkage is disposed between the slide plate and the shutter plate, is in rotatable connection to the rotation plate, and is configured to link the slide plate and the shutter plate; wherein a face, proximal to the slide plate, of the rotation plate is provided with a protrusion block; and the slide plate is provided with a second guide slot, wherein the second guide slot extends from one side, proximal to the base, of the slide plate to the other side, and the protrusion block is disposed in the second guide slot; and the two housings are respectively connected to the two support assemblies of the rotation shaft mechanism.

14. The electronic device according to claim 13, wherein the slide plate is provided with a first drive slot, the shutter plate is provided with a second drive slot, and the linkage comprises a body, a first pin shaft, and a second pin shaft, wherein the body is in rotatable connection to the rotation plate, and the first pin shaft and the second pin shaft are respectively disposed on two sides of the body and are respectively disposed in the first drive slot and the second drive slot.

15. The electronic device according to claim 14, wherein the second drive slot is a strip slot, and an extension direction of the strip slot is parallel to a rotation axis of the rotation plate, or an included angle between the extension direction of the strip slot and the rotation axis of the rotation plate is an acute angle.

16. The electronic device according to claim 14, wherein the second drive slot is a V-shaped slot, or the second drive slot comprises a strip portion and a V-shaped portion, wherein the V-shaped portion is disposed on an end of the strip portion, and an end of the V-shaped portion is connected to the end of the strip portion.

17. The electronic device according to claim 14, wherein the first drive slot is an arc slot, and the linkage comprises two first pin shafts, wherein distances between the two first pin shafts and a rotation axis of the body are equal, and the two first pin shafts are disposed in the first drive slot.

\* \* \* \* \*